US012772703B2

(12) United States Patent
Wang et al.

(10) Patent No.: US 12,772,703 B2
(45) Date of Patent: Oct. 20, 2026

(54) DISPLAY SUBSTRATE AND DISPLAY APPARATUS

(71) Applicant: BOE Technology Group Co., Ltd., Beijing (CN)

(72) Inventors: Pinfan Wang, Beijing (CN); Zheng Liu, Beijing (CN); Rui Hong, Beijing (CN); Tao Sun, Beijing (CN); Bingwei Wang, Beijing (CN); Zunqing Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 501 days.

(21) Appl. No.: 18/264,033

(22) PCT Filed: Nov. 17, 2022

(86) PCT No.: PCT/CN2022/132551

§ 371 (c)(1),
(2) Date: Aug. 2, 2023

(87) PCT Pub. No.: WO2024/103341

PCT Pub. Date: May 23, 2024

(65) Prior Publication Data

US 2025/0008822 A1 Jan. 2, 2025

(51) Int. Cl.

*H10K 59/80* (2023.01)
*H10K 59/121* (2023.01)
*H10K 59/131* (2023.01)

(52) U.S. Cl.

CPC ..... *H10K 59/8731* (2023.02); *H10K 59/1213* (2023.02); *H10K 59/1216* (2023.02); *H10K 59/131* (2023.02)

(58) Field of Classification Search

CPC ........... H10K 59/8731; H10K 59/1213; H10K 59/1216; H10K 59/131; H10K 71/80;

(Continued)

(56) References Cited

U.S. PATENT DOCUMENTS 10,135,011 B2 11/2018 Park et al.
2008/0251786 A1 10/2008 Choi et al.

(Continued)

FOREIGN PATENT DOCUMENTS

CN 104241509 A 12/2014
CN 106098724 A 11/2016

(Continued)

OTHER PUBLICATIONS

International Search Report & Written Opinion mailed Jun. 16, 2023, regarding PCT/CN2022/132551.

*Primary Examiner* — Elmito Breval
(74) *Attorney, Agent, or Firm* — Intellectual Valley Law, P.C.

(57) ABSTRACT

A display substrate is provided. The display substrate includes a plurality of islands, a plurality of gaps, and a plurality of bridges; wherein a respective island of the plurality of islands includes a base substrate; one or more light emitting elements on the base substrate; and an encapsulating layer on a side of the one or more light emitting elements away from the base substrate, encapsulating the one or more light emitting elements; the encapsulating layer includes a first inorganic encapsulating sub-layer and a second inorganic encapsulating sub-layer; and in a cross-section along a plane perpendicular to the base substrate and intersecting the first inorganic encapsulating sub-layer and the second inorganic encapsulating sub-layer, an outermost edge of the first inorganic encapsulating sub-layer is encapsulated by the second inorganic encapsulating sub-layer, thereby rendering the outermost edge of the first inorganic encapsulating sub-layer unexposed.

19 Claims, 30 Drawing Sheets

(58) Field of Classification Search
CPC ......... G09G 3/3233; G09G 2300/0426; G09G 2300/0809; G09G 2300/0819; G09G 2300/0861; G09G 2310/0251; G09G 2310/0262; G09G 2320/043
See application file for complete search history.

(56) References Cited

U.S. PATENT DOCUMENTS

| | | | |
|---|---|---|---|
| 2014/0367661 | A1 | 12/2014 | Akagawa et al. |
| 2016/0315284 | A1 | 10/2016 | Jeon |
| 2018/0342700 | A1 | 11/2018 | Cai et al. |
| 2020/0381663 | A1 | 12/2020 | Furuie |
| 2020/0388666 | A1 | 12/2020 | Park et al. |
| 2020/0403171 | A1 | 12/2020 | Park et al. |
| 2021/0005700 | A1 | 1/2021 | Park et al. |
| 2022/0049342 | A1 | 2/2022 | Zhang et al. |
| 2023/0075199 | A1 | 3/2023 | Tian et al. |

FOREIGN PATENT DOCUMENTS

| | | | |
|---|---|---|---|
| CN | 108649133 | A | 10/2018 |
| CN | 111564478 | A | 8/2020 |
| CN | 111893432 | A | 11/2020 |
| CN | 112054042 | A | 12/2020 |
| CN | 112117306 | A | 12/2020 |
| CN | 112490272 | A | 3/2021 |
| CN | 115275052 | A | 11/2022 |

DISPLAY SUBSTRATE AND DISPLAY APPARATUS

CROSS-REFERENCE TO RELATED APPLICATION

This application is a national stage application under 35 U.S.C. § 371 of International Application No. PCT/CN2022/132551, filed Nov. 17, 2022, the contents of which are incorporated by reference in the entirety.

TECHNICAL FIELD

The present invention relates to display technology, more particularly, to a display substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a display substrate, comprising a plurality of islands, a plurality of gaps, and a plurality of bridges; wherein a respective island of the plurality of islands comprises: a base substrate; one or more light emitting elements on the base substrate; and an encapsulating layer on a side of the one or more light emitting elements away from the base substrate, encapsulating the one or more light emitting elements; the encapsulating layer comprises a first inorganic encapsulating sub-layer on a side of the one or more light emitting elements away from the base substrate, and a second inorganic encapsulating sub-layer on a side of the first inorganic encapsulating sub-layer away from the base substrate; and in a cross-section along a plane perpendicular to the base substrate and intersecting the first inorganic encapsulating sub-layer and the second inorganic encapsulating sub-layer, an outermost edge of the first inorganic encapsulating sub-layer is encapsulated by the second inorganic encapsulating sub-layer, thereby rendering the outermost edge of the first inorganic encapsulating sub-layer unexposed.

Optionally, an outermost edge of the second inorganic encapsulating sub-layer in the respective island is spaced apart from an outermost edge of the base substrate in the respective island along a respective gap of the plurality of gaps by a distance d1, d1>0.

Optionally, the display substrate comprises a stacked structure comprising a plurality of insulating layers on a second base substrate in a respective bridge of the plurality of bridges; wherein, in the cross-section, an outermost edge of the stacked structure is spaced apart from an outermost edge of the second base substrate in the respective bridge along a respective gap of the plurality of gaps by a distance d2, d2>0.

Optionally, the outermost edge of the stacked structure is an outermost edge of a portion of the second inorganic encapsulating sub-layer in the respective bridge.

Optionally, the outermost edge of the stacked structure is an outermost edge of a portion of a planarization layer in the respective bridge.

Optionally, a thickness of the second base substrate in the respective bridge is less than a thickness of the base substrate in the respective island; and the second base substrate in the respective bridge and the base substrate in the respective island are connected by an adhesive layer in the respective gap.

Optionally, inorganic layers in the plurality of islands and the plurality of bridges are absent in the plurality of gaps; and the base substrate in the respective island and a second base substrate in a respective bridge of the plurality of bridges are absent in the plurality of gaps.

Optionally, the respective island comprises an inorganic insulating layer on the base substrate; and a portion of the second inorganic encapsulating sub-layer is in direct contact with the inorganic insulating layer in an inorganic layer contact area.

Optionally, the display substrate is substantially free of any organic material between the second inorganic encapsulating sub-layer and the inorganic insulating layer in the inorganic layer contact area.

Optionally, the inorganic insulating layer extends substantially throughout the respective island; and a thickness of a portion of the inorganic insulating layer in the inorganic layer contact area is less than a thickness of a portion of the inorganic insulating layer outside the inorganic layer contact area and in the respective island.

Optionally, a portion of the first inorganic encapsulating sub-layer is in direct contact with the inorganic insulating layer.

Optionally, in a cross-section along a plane perpendicular to the base substrate and intersecting the inorganic insulating layer, the first inorganic encapsulating sub-layer, and the second inorganic encapsulating sub-layer, the inorganic layer contact area has an average width less than 5 μm; and a respective light emitting element in the respective island that is closest to a respective gap of the plurality of gaps has an average distance to the respective gap less than 20 μm.

Optionally, the inorganic insulating layer is a second passivation layer; a portion of the second passivation layer outside the inorganic layer contact area is in direct contact with an anode of the one or more light emitting elements.

Optionally, the display substrate in the respective island, further comprising: a first groove; one or more first pillars; wherein a respective first pillar of the one or more first pillars extends into the first groove.

Optionally, the respective first pillar substantially surrounds a region having transistors and capacitors of one or more pixel driving circuits of the respective island.

Optionally, the first groove extends through a first passivation layer and extend into a planarization layer; and the respective first pillar comprises a portion of a second passivation layer which is on a side of the first passivation layer away from the base substrate, a portion of a common layer, a portion of the first inorganic encapsulating sub-layer, and a portion of an organic encapsulating sub-layer of the encapsulating layer.

Optionally, in a region transitioning from the respective island to a respective bridge of the plurality of bridges, the display substrate further comprises: a second groove; and one or more second pillars; wherein a respective second pillar of the one or more second pillars extends into the second groove.

Optionally, the second groove extends through a first passivation layer and extend into a planarization layer; and the respective second pillar comprises a portion of a second passivation layer which is on a side of the first passivation layer away from the base substrate.

Optionally, the respective island comprises a stacked structure comprising a plurality of insulating layers between the base substrate and the first inorganic encapsulating sub-layer; in a cross-section along a plane perpendicular to the base substrate and intersecting the plurality of insulating layers in the stacked structure, any of the plurality of insulating layers are completely unexposed; outermost edges of the plurality of insulating layer are encapsulated by the first inorganic encapsulating sub-layer, thereby rendering the outermost edges of the plurality of insulating layer unexposed; and the first inorganic encapsulating sub-layer and the second inorganic encapsulating sub-layer are in direct contact with the base substrate.

In another aspect, the present disclosure provides a display apparatus, comprising the above display substrate herein or fabricated by a method described herein, and one or more integrated circuits connected to the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display substrate and a display apparatus that substantially obviate one or more of the problems due to limitations and disadvantages of the related art. In one aspect, the present disclosure provides a display substrate. In some embodiments, the display substrate includes a plurality of islands, a plurality of gaps, and a plurality of bridges. Optionally, a respective island of the plurality of islands includes a base substrate; one or more light emitting elements on the base substrate; and an encapsulating layer on a side of one or more light emitting elements away from the base substrate, encapsulating the one or more light emitting elements. Optionally, the encapsulating layer comprises a first inorganic encapsulating sub-layer on the one or more light emitting elements and a second inorganic encapsulating sub-layer on a side of the organic encapsulating sub-layer away from the first inorganic encapsulating sub-layer.

Optionally, in a cross-section along a plane perpendicular to the base substrate and intersecting the first inorganic encapsulating sub-layer and the second inorganic encapsulating sub-layer, an outermost edge of the first inorganic encapsulating sub-layer is encapsulated by the second inorganic encapsulating sub-layer, thereby rendering the outermost edge of the first inorganic encapsulating sub-layer unexposed.

Figure 1:
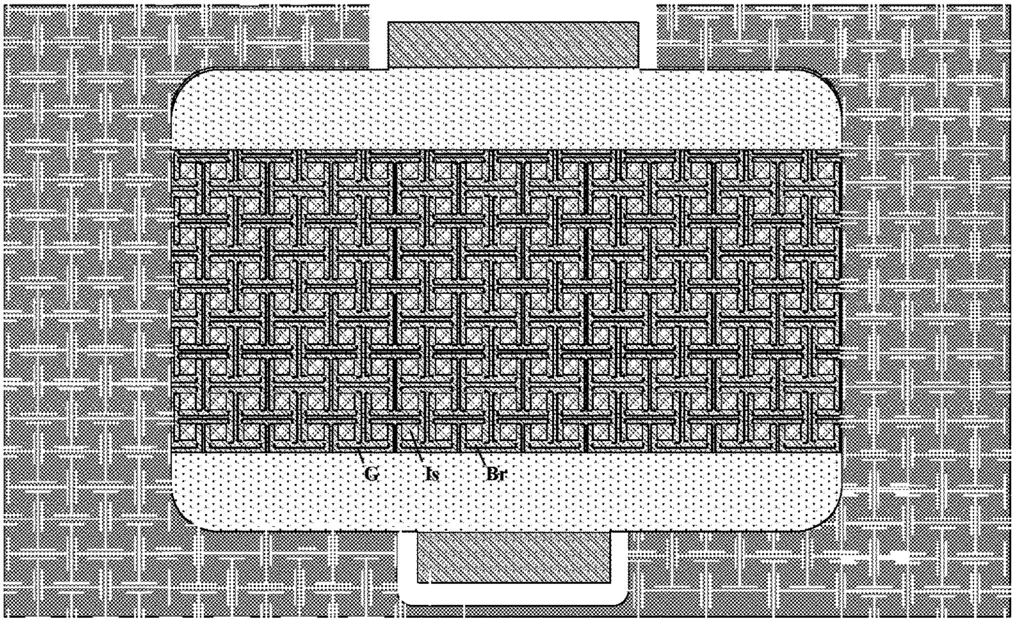
FIG. 1 is a schematic diagram illustrating the structure of a display substrate in some embodiments according to the present disclosure.

FIG. 1 is a schematic diagram illustrating the structure of a display substrate in some embodiments according to the present disclosure. Referring to FIG. 1, the display substrate in some embodiments is a stretchable display substrate. As used herein, the term "stretchable" refers to the ability of a material, structure, device or device component to be strained in tension (e.g., being made longer and/or wider) without undergoing permanent deformation or failure such as fracture, e.g., the ability to elongate at least 10% of its length without permanently deforming, tearing, or breaking. The term is also meant to encompass substrates having components (whether or not the components themselves are individually stretchable as stated above) that are configured in such a way so as to accommodate a stretchable, inflatable, or expandable surface and remain functional when applied to a stretchable, inflatable, or otherwise expandable surface that is stretched, inflated, or otherwise expanded respectively. The term is also meant to encompass substrates that may be elastically and/or plastically deformable (i.e. after being stretched, the substrate may return to its original size when the stretching force is released or the substrate may not return to its original size and in some examples, may remain in the stretched form) and the deformation (i.e. stretching and optionally flexing) may occur during manufacture of the substrate (e.g. with the substrate being stretched and optionally flexed to form its final shape), during assembly of a device incorporating the substrate (which may be considered part of the manufacturing operation) and/or during use (e.g. with the user being able to stretch and optionally flex the substrate).

In some embodiments, the display substrate includes a plurality of islands Is and a plurality of bridges Br connecting the plurality of islands Is (discussed further in details below). A respective island of the plurality of islands Is includes at least one display element (e.g., at least one light emitting diode). The display substrate further includes a plurality of gaps G at least partially extending into (e.g., extending through) the display substrate. A respective gap of the plurality of gaps G is between adjacent islands of the plurality of islands Is.

Figure 2:
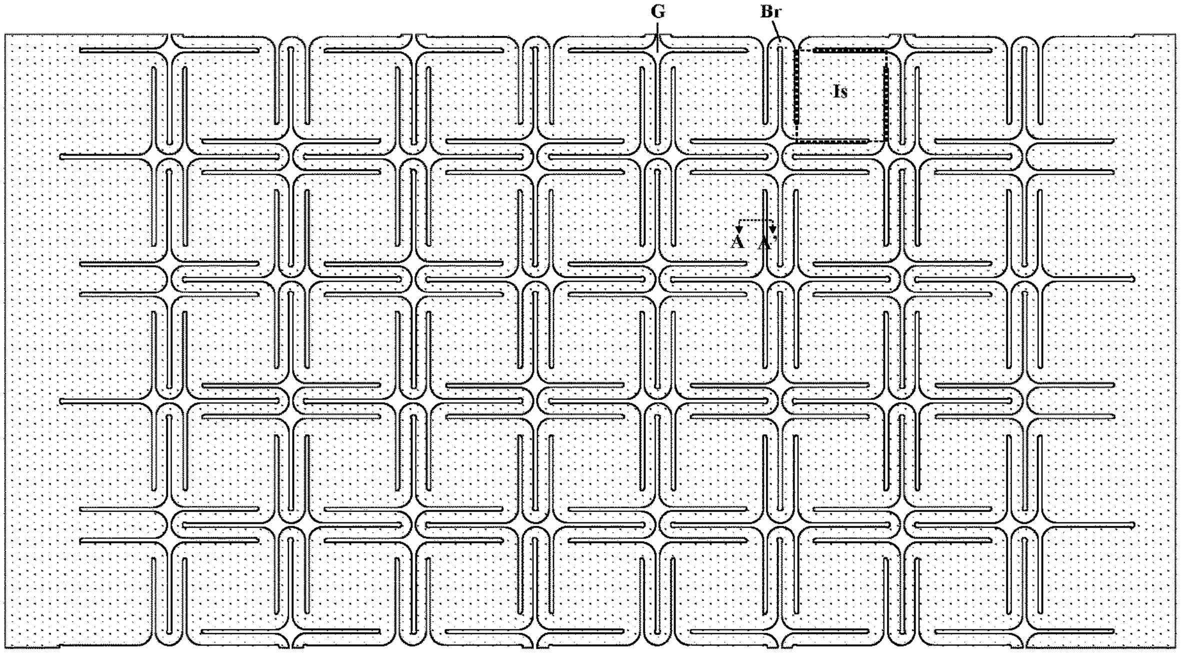
FIG. 2 is a schematic diagram illustrating a layout of islands, bridges, and gaps in a display substrate in some embodiments according to the present disclosure.

FIG. 2 is a schematic diagram illustrating a layout of islands, bridges, and gaps in a display substrate in some embodiments according to the present disclosure. Referring to FIG. 2, a respective bridge of the plurality of bridges Br connects two adjacent islands of the plurality of islands Is (e.g., two adjacent islands in a same row or two adjacent islands in a same column). A respective gap of the plurality of gaps G is between two adjacent islands of the plurality of islands Is.

In the specific example depicted in FIG. 2, the respective gap of the plurality of gaps G is between four adjacent islands of the plurality of islands Is. The respective gap has a ╪ shape. The respective bridge has a hairpin shape. The respective gap is surrounded by four bridges of the plurality of bridges Br and four islands of the plurality of islands Is. An individual gap extends into a space between two stems of an individual hairpin of the respective bridge. The respective gap extends into inter-stem spaces of two of the four bridges surrounding the respective gap, respectively. The respective gap further extends into spaces between the other two of the four bridges and the four islands surrounding the respective gap, respectively.

Figure 3:
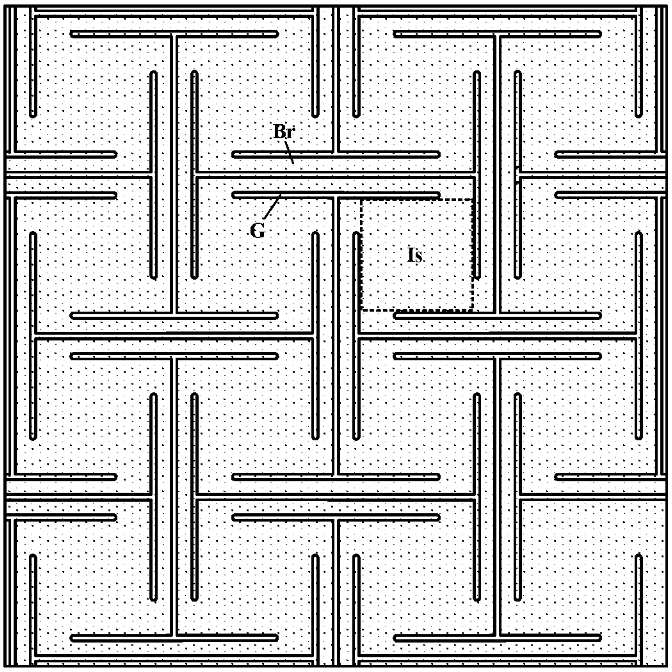
FIG. 3 is a schematic diagram illustrating a layout of islands, bridges, and gaps in a display substrate in some embodiments according to the present disclosure.

Various alternative implementations may be practiced in the present disclosure. For example, an individual bridge of the plurality of bridges may have a substantially straight line shape, and an individual gap of the plurality of gaps may have a H shape. FIG. 3 is a schematic diagram illustrating a layout of islands, bridges, and gaps in a display substrate in some embodiments according to the present disclosure. Referring to FIG. 3, a respective bridge of the plurality of bridges Br connects two adjacent islands of the plurality of islands Is (e.g., two adjacent islands in a same row or two adjacent islands in a same column). A respective gap of the plurality of gaps G is between two adjacent islands of the plurality of islands Is.

In the specific example depicted in FIG. 3, the respective gap of the plurality of gaps G is between four adjacent islands of the plurality of islands Is. The respective gap has a H shape. The respective bridge has a substantially straight line shape. The respective gap is surrounded by four bridges of the plurality of bridges Br and four islands of the plurality of islands Is. The respective gap spaces apart two bridges of the four bridges. The respective gap further extends into spaces between the other two of the four bridges and the four islands surrounding the respective gap, respectively.

Figure 4:
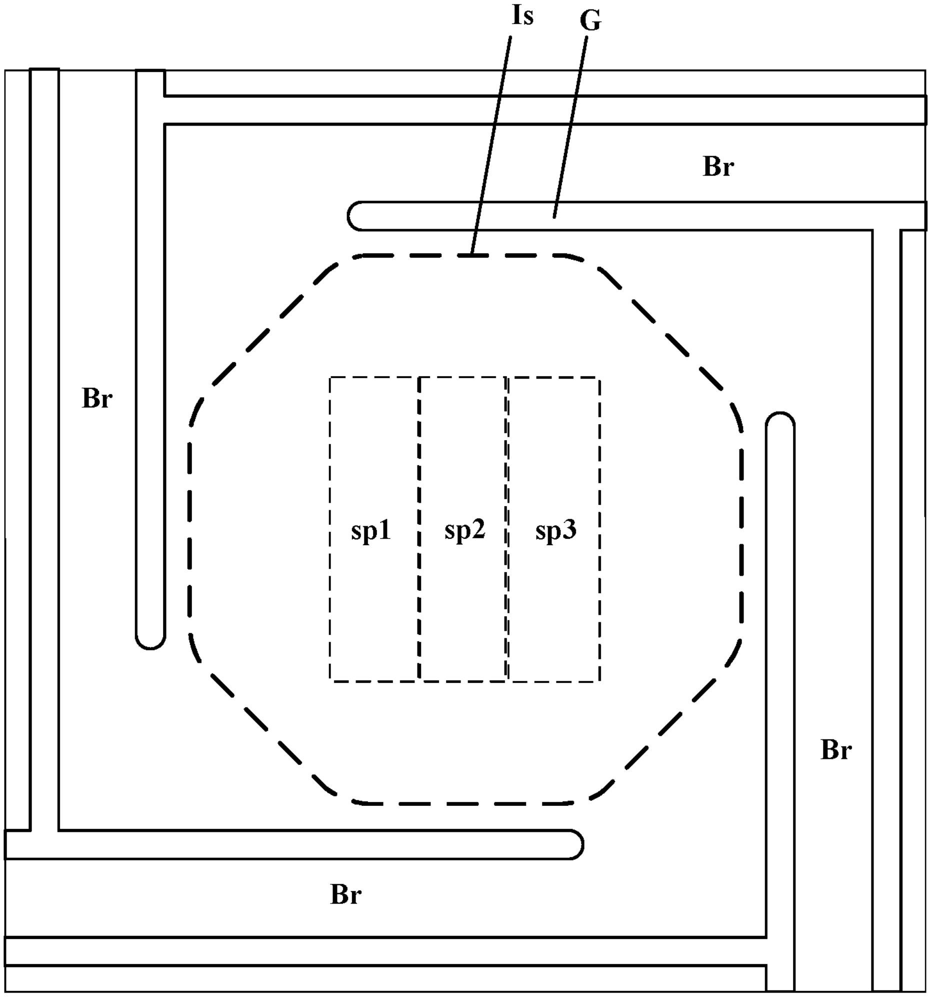
FIG. 4 is a schematic diagram illustrating a portion of a display area in a display substrate in some embodiments according to the present disclosure.

FIG. 4 is a schematic diagram illustrating a portion of a display area in a display substrate in some embodiments according to the present disclosure. FIG. 4 illustrates a respective island of the plurality of islands Is and four bridges of the plurality of bridges Br connected to the respective island. As shown in FIG. 4, a respective gap of the plurality of gaps G is between two adjacent islands and/or between a bridge and an island adjacent to each other.

In one example, the display substrate includes a single subpixel in the respective island.

In another example, the display substrate includes a plurality of subpixels in the respective island. In one particular example depicted in FIG. 4, the display substrate includes a first subpixel sp1 (e.g., a red subpixel), a second subpixel sp2 (e.g., a green subpixel), and a third subpixel sp3 (e.g., a blue subpixel). Each subpixel includes a display element (e.g., a light emitting diode).

Various appropriate pixel driving circuits may be used for driving light emission in the display elements in the display area. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present display substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 5A:
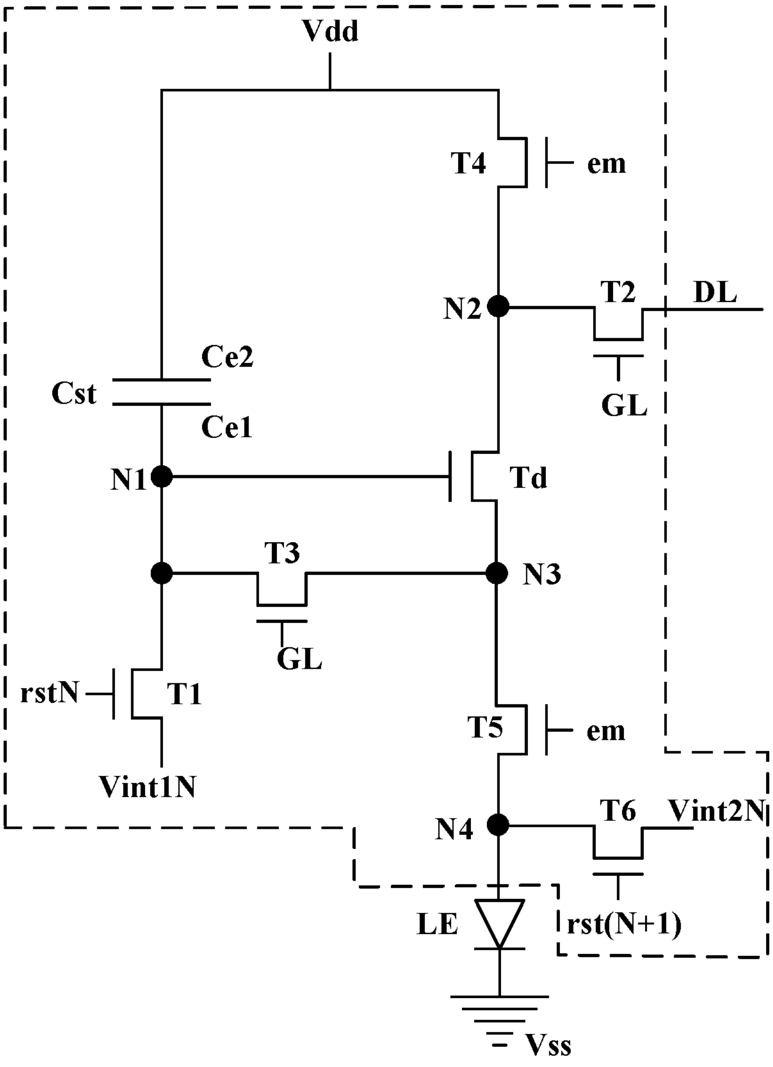
FIG. 5A is a circuit diagram illustrating the structure of a pixel driving circuit in some embodiments according to the present disclosure.

FIG. 5A is a circuit diagram illustrating the structure of a pixel driving circuit in some embodiments according to the present disclosure. Referring to FIG. 5A, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage (or a present row) of a plurality of reset control signal lines, a first electrode connected to a respective first reset signal line VintIN in a present stage (or a present row) of a plurality of first reset signal lines, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to a respective reset control signal line rst (N+1) in a next adjacent stage (or a next adjacent row) of a plurality of reset control signal lines, a first electrode connected to a respective second reset signal line Vint2N in the present stage (or the present row) of the plurality of second reset signal lines, and a second electrode connected to the second electrode of the fifth transistor and the anode of the light emitting element LE. The second capacitor electrode Ce2 is connected to the respective voltage supply line and the first electrode of the fourth transistor T4.

Figure 5B:
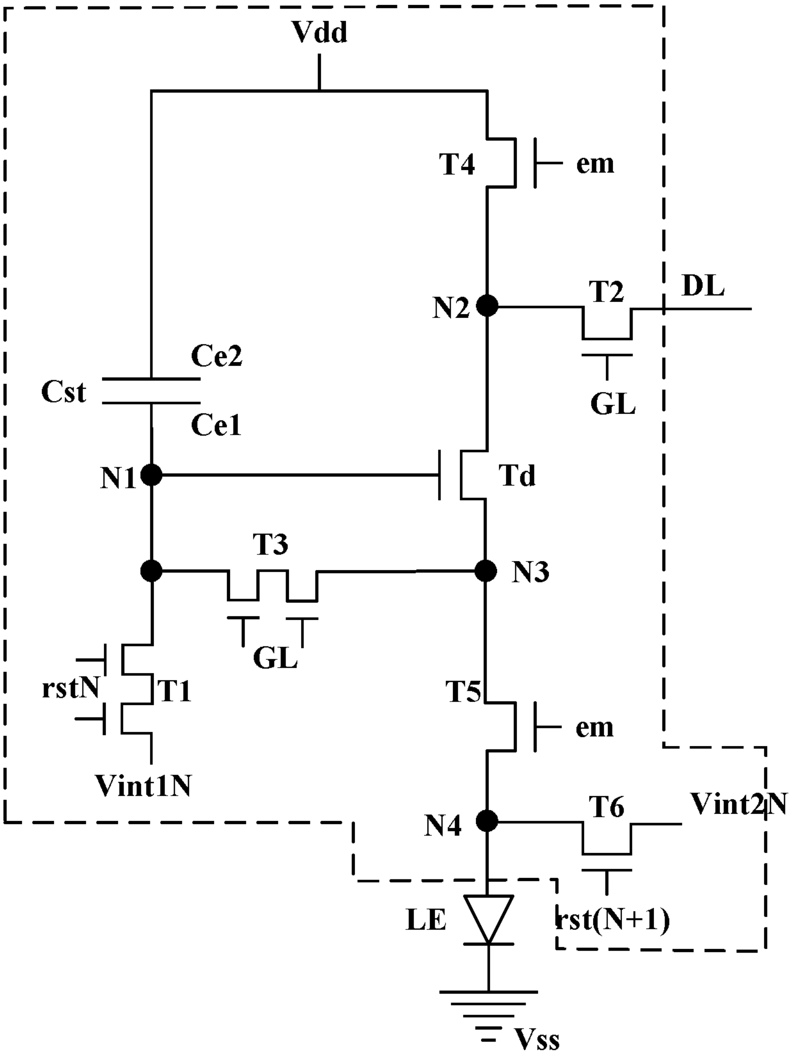
FIG. 5B is a circuit diagram illustrating the structure of a pixel driving circuit in some embodiments according to the present disclosure.

FIG. 5B is a circuit diagram illustrating the structure of a pixel driving circuit in some embodiments according to the present disclosure. Referring to FIG. 5B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the first electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the second electrode of the third transistor T3, and the first electrode of the fifth transistor T5. The fourth node N4 is connected to the second electrode of the fifth transistor T5, the second electrode of the sixth transistor T6, the second electrode of the sensing transistor Ts, and the anode of the light emitting element LE.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

Figure 6A:
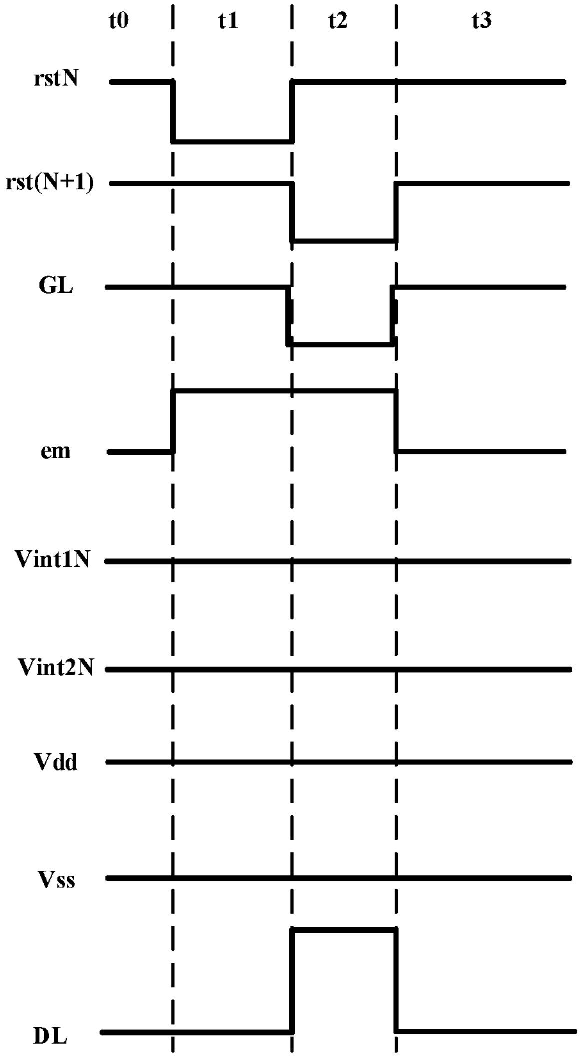
FIG. 6A is a timing diagram illustrating the operation of a pixel driving circuit in some embodiments according to the present disclosure.

FIG. 6A is a timing diagram illustrating the operation of a pixel driving circuit in some embodiments according to the present disclosure. Referring to FIG. 5A, FIG. 5B, and FIG. 6A, during one frame of image, the operation of the pixel driving circuit includes a reset sub-phase t1, a data write sub-phase t2, and a light emitting sub-phase t3. In the initial sub-phase t0, a turning-off reset control signal is provided through the reset control signal line of a present stage rstN to the gate electrode of the first transistor T1 to turn off the first transistor T1. In the initial sub-phase t0, the gate line GL is provided with a turning-off signal, thus the second transistor T2 and the third transistor T3 are turned off.

In the reset sub-phase t1, a turning-on reset control signal is provided through the reset control signal line of a present stage rstN to the gate electrode of the first transistor T1 to turn on the first transistor T1; allowing an initialization voltage signal from the respective first reset signal line of a present stage VintIN to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective voltage supply line of the plurality of voltage supply lines Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a high voltage signal to turn off the fourth transistor T4 and the fifth transistor T5.

In the data write sub-phase t2, the turning-off reset control signal is again provided through the reset control signal line of a present stage rstN to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the second electrode of the third transistor T3. A gate electrode of the driving transistor Td is electrically connected with the first electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase t2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a high voltage signal to turn off the fourth transistor T4 and the fifth transistor T5.

In the data write sub-phase t2, a turning-on reset control signal is provided through the respective reset control signal line rst(N+1) in a next adjacent stage to the gate electrode of the sixth transistor T6 to turn on the sixth transistor T6; allowing an initialization voltage signal from the respective second reset signal line of a present stage Vint2N to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the reset control signal line of a present stage rstN to the gate electrode of the first transistor T1 to turn off the first transistor T1. The respective gate line of the plurality of gate lines GL is provided with a turning-off signal, the second transistor T2 and the third transistor T3 are turned off. The respective light emitting control signal line of the plurality of light emitting control signal lines em is provided with a low voltage signal to turn on the fourth transistor T4 and the fifth transistor T5. The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

Figure 5C:
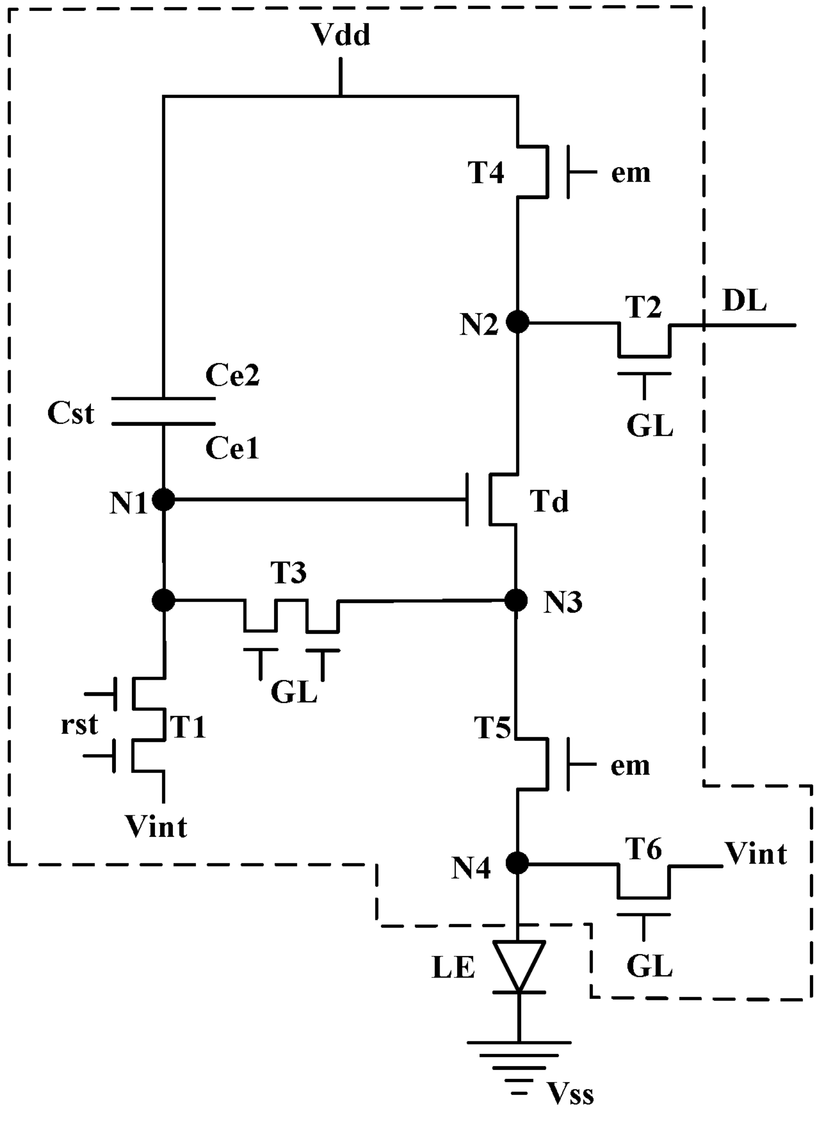
FIG. 5C is a circuit diagram illustrating the structure of a pixel driving circuit in some embodiments according to the present disclosure.
Figure 6B:
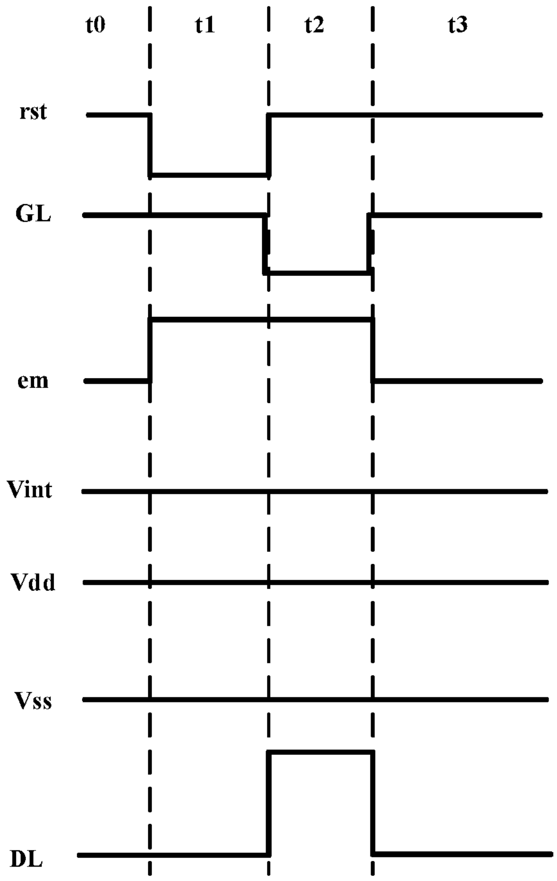
FIG. 6B is a timing diagram illustrating the operation of a pixel driving circuit in some embodiments according to the present disclosure.

FIG. 5C is a circuit diagram illustrating the structure of a pixel driving circuit in some embodiments according to the present disclosure. Referring to FIG. 5C, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective reset control signal line of a plurality of reset control signal lines rst, a first electrode connected to a respective reset signal line of a plurality of first reset signal lines Vint, and a second electrode connected to a first capacitor electrode Ce1 of the storage capacitor Cst and a gate electrode of the driving transistor Td; a second transistor T2 having a gate electrode connected to a respective gate line of a plurality of gate lines GL, a first electrode connected to a respective data line of a plurality of data lines DL, and a second electrode connected to a first electrode of the driving transistor Td; a third transistor T3 having a gate electrode connected to the respective gate line, a first electrode connected to the first capacitor electrode Ce1 of the storage capacitor Cst and the gate electrode of the driving transistor Td, and a second electrode connected to a second electrode of the driving transistor Td; a fourth transistor T4 having a gate electrode connected to a respective light emitting control signal line of a plurality of light emitting control signal lines em, a first electrode connected to a respective voltage supply line of a plurality of voltage supply lines Vdd, and a second electrode connected to the first electrode of the driving transistor Td and the second electrode of the second transistor T2; a fifth transistor T5 having a gate electrode connected to the respective light emitting control signal line, a first electrode connected to second electrodes of the driving transistor Td and the third transistor T3, and a second electrode connected to an anode of a light emitting element LE; and a sixth transistor T6 having a gate electrode connected to the respective gate line of the plurality of gate lines GL, a first electrode connected to the respective reset signal line of the plurality of first reset signal lines Vint, and a second electrode connected to the second electrode of the fifth transistor and the anode of the light emitting element LE. The second capacitor electrode Ce2 is connected to the respective voltage supply line and the first electrode of the fourth transistor T4. FIG. 6B is a timing diagram illustrating the operation of a pixel driving circuit in some embodiments according to the present disclosure. FIG. 6B illustrates the operation of the pixel driving circuit depicted in FIG. 5C.

Figure 7A:
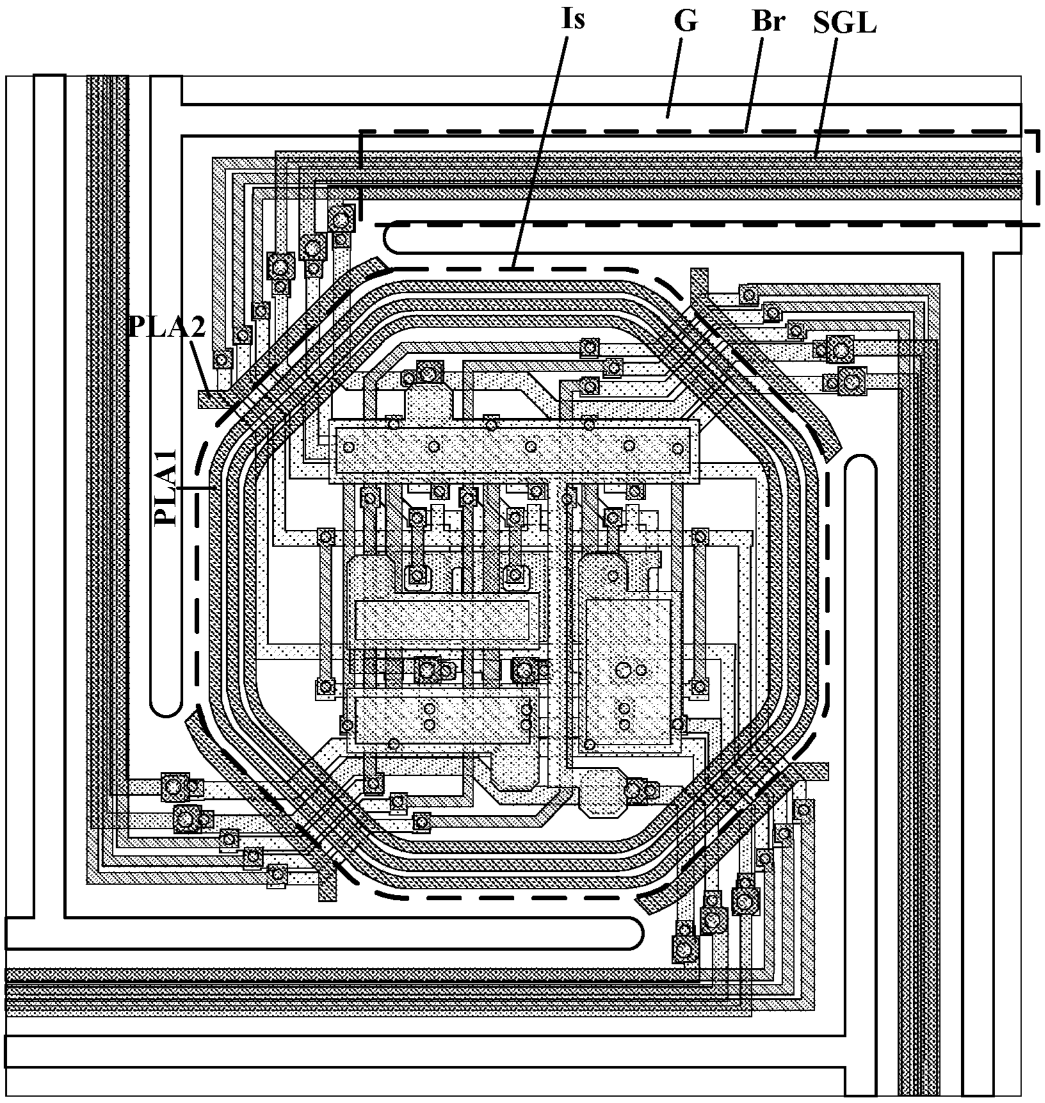
FIG. 7A is a schematic diagram illustrating the structure of a portion of a display substrate in some embodiments according to the present disclosure.

FIG. 7A is a schematic diagram illustrating the structure of a portion of a display substrate in some embodiments according to the present disclosure. Referring to FIG. 7A, a respective island of the plurality of islands Is is shown. The display substrate further includes a plurality of signal lines SGL connecting adjacent islands of the plurality of islands Is. An individual signal line of the plurality of signal lines SGL extends at least partially through an individual bridge of the plurality of bridges Br. Examples of signal lines extending through the bridges include gate lines, data lines, voltage supply lines, light emitting control signal lines, reset signal lines, and reset control signal lines. The plurality of signal lines SGL may be disposed in any appropriate layer including a first conductive layer, a second conductive layer, a first signal line layer, a second signal line layer, and an anode material layer.

In some embodiments, the plurality of islands Is are a plurality of encapsulated islands. The display substrate includes an encapsulating layer on a side of one or more light emitting elements in the respective island, encapsulating the one or more light emitting elements. The inventors of the present disclosure discover a novel encapsulating structure that effectively prevents air and moisture from entering the respective island and effectively reduces tensile stress in the islands and bridges during a stretching process.

Figure 7B:
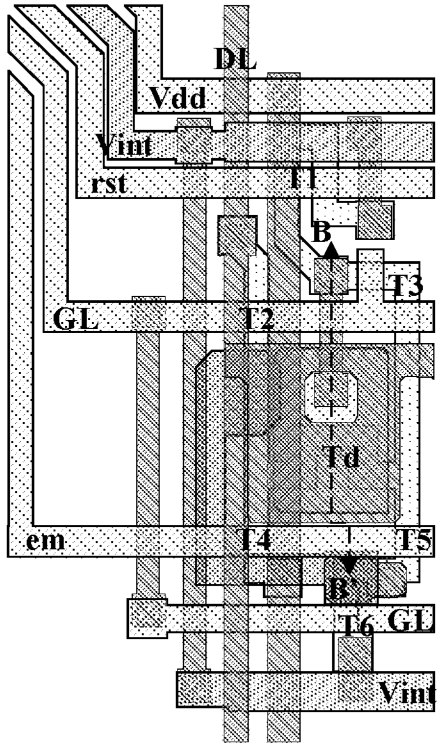
FIG. 7B is a schematic diagram illustrating the structure of a display substrate in some embodiments according to the present disclosure.
Figure 7C:
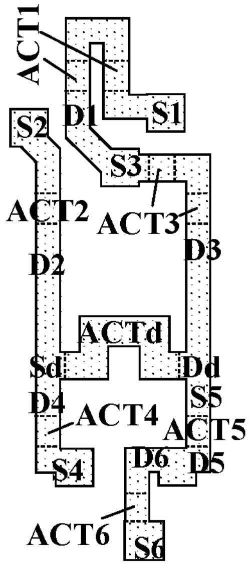
FIG. 7C is a diagram illustrating the structure of a semiconductor material layer in the display substrate depicted in FIG. 7B.
Figure 7D:
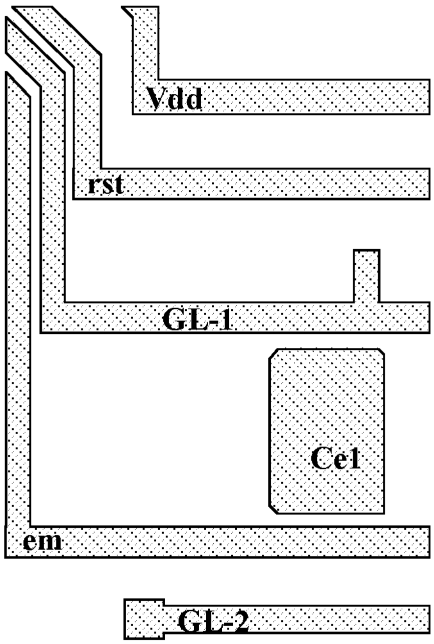
FIG. 7D is a diagram illustrating the structure of a first conductive layer in the display substrate depicted in FIG. 7B.
Figure 7E:
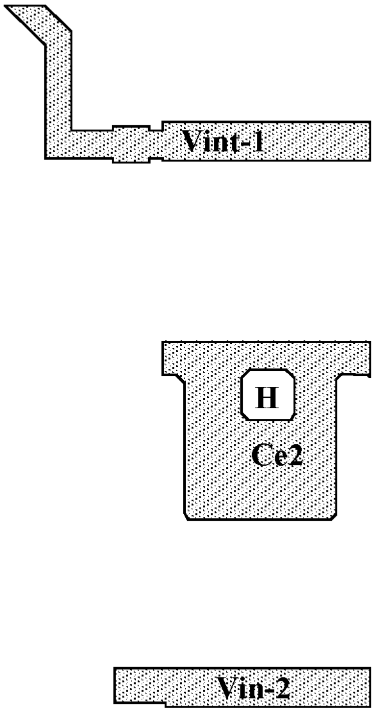
FIG. 7E is a diagram illustrating the structure of a second conductive layer in the display substrate depicted in FIG. 7B.
Figure 7F:
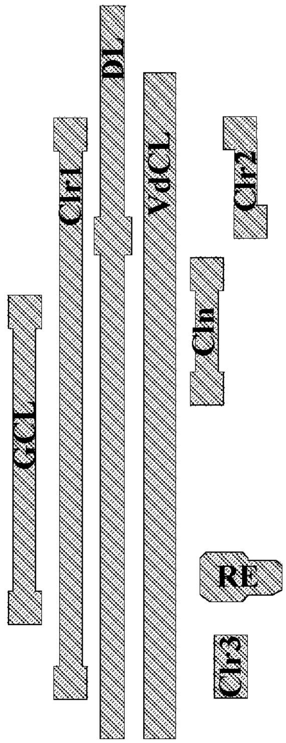
FIG. 7F is a diagram illustrating the structure of a first signal line layer in the display substrate depicted in FIG. 7B.
Figure 7G:
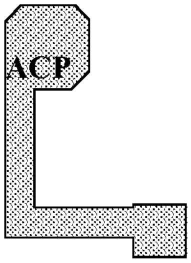
FIG. 7G is a diagram illustrating the structure of a second signal line layer in the display substrate depicted in FIG. 7B.
Figure 7H:
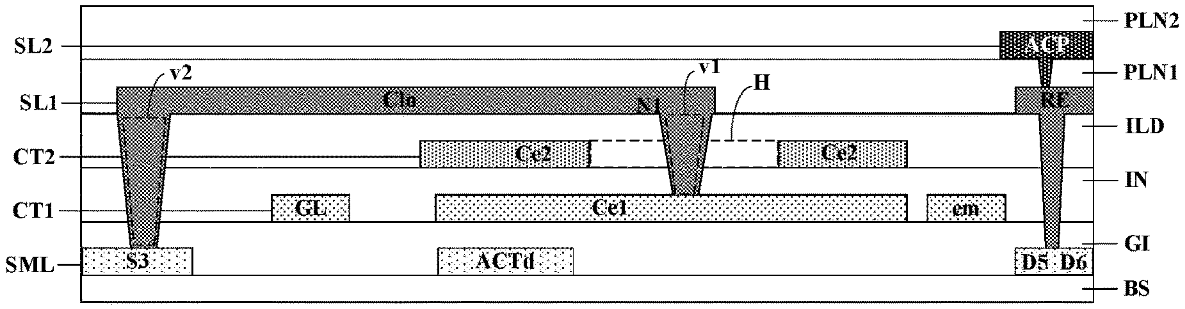
FIG. 7H is a cross-sectional view along a B-B' line in FIG. 7B.

FIG. 7B is a diagram illustrating the structure of the structure of a display substrate in some embodiments according to the present disclosure. FIG. 7C is a diagram illustrating the structure of a semiconductor material layer in the display substrate depicted in FIG. 7B. FIG. 7D is a diagram illustrating the structure of a first conductive layer in the display substrate depicted in FIG. 7B. FIG. 7E is a diagram illustrating the structure of a second conductive layer in the display substrate depicted in FIG. 7B. FIG. 7F is a diagram illustrating the structure of a first signal line layer in the display substrate depicted in FIG. 7B. FIG. 7G is a diagram illustrating the structure of a second signal line layer in the display substrate depicted in FIG. 7B. FIG. 7H is a cross-sectional view along a B-B' line in FIG. 7B. In one example, FIG. 7B to FIG. 7H depict a pixel driving circuit configured to driving light emission in the first subpixel sp1 depicted in FIG. 4.

FIG. 7B illustrates the structures of several layers of the display substrate, including a semiconductor material layer, a first conductive layer, a second conductive layer, a first signal line layer, and a second signal line layer. Corresponding positions of the plurality of transistors in the pixel driving circuit are depicted in FIG. 7B. The pixel driving circuit in some embodiments includes the first transistor T1, the second transistor T2, the third transistor T3, the fourth transistor T4, the fifth transistor T5, the sixth transistor T6, and the driving transistor Td.

Referring to FIG. 7B to FIG. 7H, in some embodiments, the display substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, and a second planarization layer PLN2 on a side of the second signal line layer SL2 away from the first planarization layer PLN1.

Referring to FIG. 7B, the display substrate in some embodiments includes a respective gate line of a plurality of gate lines GL, a respective reset control signal line of a plurality of reset control signal lines rst; a respective reset signal line of a plurality of reset signal lines Vint; a respective light emitting control signal line of a plurality of light emitting control signal lines em; a respective voltage supply line of a plurality of voltage supply lines Vdd; and a respective data line of a plurality of data lines DL.

Referring to FIG. 7B and FIG. 7C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd. In one example, the active layers (ACT1, ACT2, ACT3, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) are in a same layer.

As used herein, the term "same layer" refers to the relationship between the layers simultaneously formed in the same step. In one example, the active layers, the first electrodes, and the second electrodes are in a same layer when they are formed as a result of one or more steps of a same patterning process performed in a same layer of material. In another example, the active layers, the first electrodes, and the second electrodes can be formed in a same layer by simultaneously performing the step of forming the active layers, the step of forming the first electrodes, and the step of forming the second electrodes. The term "same layer" does not always mean that the thickness of the layer or the height of the layer in a cross-sectional view is the same.

As used herein, the active layer refers to a component of the transistor comprising at least a portion of the semiconductor material layer whose orthographic projection on the base substrate overlaps with an orthographic projection of a gate electrode on the base substrate. As used herein, a first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Referring to FIG. 7B and FIG. 7D, the first conductive layer in some embodiments includes a respective gate line of the plurality of gate lines GL, a respective reset control signal line of the plurality of reset control signal lines rst, a respective light emitting control signal line of the plurality of light emitting control signal lines em, a respective voltage supply line of a plurality of voltage supply lines Vdd, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

In some embodiments, the respective gate line in the respective island includes a first gate branch line GL-1 and a second gate branch line GL-2. Referring to FIG. 7B, FIG. 7D, and FIG. 7F, in some embodiment, the first gate branch line GL-1 and the second gate branch line GL-2 are connected by one or more gate connecting lines GCL. In one example, the first gate branch line GL-1 and the second gate branch line GL-2 are in the first conductive layer, and the one or more gate connecting lines GCL are in the first signal line layer. The first gate branch line GL-1 is configured to provide a gate scanning signal to the second transistor T2 and the third transistor T3. The second gate branch line GL-2 is configured to provide a gate scanning signal to the sixth transistor T6.

Referring to FIG. 7B and FIG. 7E, the second conductive layer in some embodiments includes a respective reset signal line of the plurality of reset signal lines Vint and a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the respective reset signal line of the plurality of reset signal lines Vint and a second capacitor electrode Ce2 are in a same layer.

In some embodiments, the respective reset signal line in the respective island includes a first reset signal branch line Vint-1 and a second reset signal branch line Vint-2. Referring to FIG. 7B, FIG. 7D, and FIG. 7F, in some embodiment, the first reset signal branch line Vint-1 and the second reset signal branch line Vint-2 are connected by one or more first reset signal connecting lines Clr1. In one example, the first reset signal branch line Vint-1 and the second reset signal branch line Vint-2 are in the second conductive layer, and the one or more first reset signal connecting lines Clr1 is in the first signal line layer. The first reset signal branch line Vint-1 is configured to provide a reset signal to the first transistor T1. The second reset signal branch line Vint-2 is configured to provide a reset signal to the sixth transistor T6.

Referring to FIG. 7B and FIG. 7F, the first signal line layer in some embodiments includes a node connecting line Cln, one or more first reset signal connecting lines Clr1, a second reset signal connecting line Clr2, a third reset signal connecting line Clr3, one or more gate connecting lines GCL, a respective data line of the plurality of data lines DL, a relay electrode RE, and one or more voltage supply connecting lines VdCL. The node connecting line Cln connects the first capacitor electrode Ce1 and the source electrode of the third transistor T3 in a respective pixel driving circuit together. The relay electrode RE connects the node N4 and an anode connecting pad together. The node N4 is connected to drain electrodes of the fifth transistor T5 and the sixth transistor T6. The anode connecting pad is in the second signal line layer, and is connected to a respective anode in a respective light emitting element. The one or more first reset signal connecting lines Clr1 connects the first reset signal branch line Vint-1 to the second reset signal branch line Vint-2. The one or more voltage supply connecting lines VdCL connects a respective voltage supply line of a plurality of voltage supply lines to a first electrode of the fourth transistor T4. The second reset signal connecting line Clr2 connects the first reset signal branch line Vint-1 to a first electrode of the first transistor T1. The third reset signal connecting line Clr3 connects the second reset signal branch line Vint-2 to a first electrode of the sixth transistor T6.

Referring to FIG. 7B to FIG. 7H, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as the one or more first reset signal connecting lines Clr1, the second reset signal connecting line Clr2, the third reset signal connecting line Clr3, the one or more gate connecting lines GCL, the respective data line of the plurality of data lines DL, the relay electrode RE, and the one or more voltage supply connecting lines VdCL.

In some embodiments, the first capacitor electrode Ce1 is on a side of the gate insulating layer IN away from the base substrate BS. Optionally, the display substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Cln is connected to the first capacitor electrode Ce1 through the first via v1, and the node connecting line Cln is connected the semiconductor material layer SML through the second via v2. Optionally, the node connecting line Cln is connected to the source electrode S3 of third transistor, as depicted in FIG. 7H.

Referring to Referring to FIG. 7B and FIG. 7G, the second signal line layer in some embodiments includes an anode contact pad ACP. The anode contact pad ACP is electrically connected to a source electrode of the fifth transistor T5 in the respective pixel driving circuit through a relay electrode. The anode contact pad ACP is electrically connected to an anode in a respective light emitting element.

Various appropriate conductive materials and various appropriate fabricating methods may be used to make the first signal line layer and the second signal line layer. For example, a conductive material may be deposited on the substrate by a plasma-enhanced chemical vapor deposition (PECVD) process and patterned. Examples of appropriate conductive materials for making the first signal line layer or the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Figure 8:
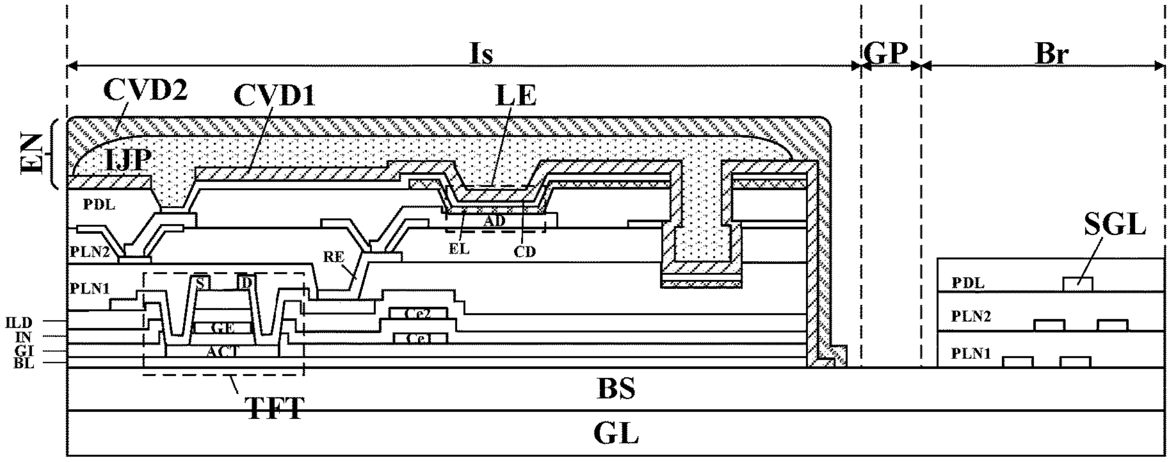
FIG. 8 is a cross-sectional view of a portion of a display substrate in some embodiments according to the present disclosure.

FIG. 8 is a cross-sectional view of a portion of a display substrate in some embodiments according to the present disclosure. FIG. 8 may be a cross-sectional view, e.g., along an A-A' line in FIG. 2. Referring to FIG. 8, the display substrate in some embodiments includes a plurality of Islands Is, a plurality of gaps G, and a plurality of bridges Br.

In some embodiments, the plurality of Islands Is are a plurality of encapsulated islands. The display substrate includes an encapsulating layer EN on a side of one or more light emitting elements LE in the respective island away from a base substrate BS, encapsulating the one or more light emitting elements LE.

The display substrate in some embodiments further includes a base substrate BS, and a plurality of thin film transistors TFT on the base substrate BS. The plurality of thin film transistors TFT are configured to drive light emission in the one or more light emitting elements LE. In some embodiments, the display substrate is disposed on a glass plate GL. Optionally, the glass plate GL is removed before the display substrate is assembled into a display panel. Various appropriate materials may be used for making the base substrate BS. Examples of materials suitable for making the base substrate include, but are not limited to, glass, quartz, polyimide, and polyester, etc. The base substrate BS may be made of a stretchable material such as polyimide when the display substrate is a stretchable display substrate.

In some embodiments, at least in the respective island, the display substrate includes a base substrate BS, a barrier layer BL on the base substrate BS, an active layer ACT on a side of the barrier layer BL away from the base substrate BS, a gate insulating layer GI on a side of the active layer ACT away from the base substrate BS, a gate electrode GE and a first capacitor electrode Ce1 of a storage capacitor on a side of the gate insulating layer GI away from the base substrate BS, an insulating layer IN on a side of the gate electrode GE and the first capacitor electrode Ce1 away from the base substrate BS, a second capacitor electrode Ce2 of the storage capacitor on a side of the insulating layer IN away from the base substrate BS, an inter-layer dielectric layer ILD on a side of the second capacitor electrode Ce2 away from the base substrate BS, a source electrode S and a drain electrode D on a side of the inter-layer dielectric layer ILD away from the base substrate BS, a first planarization layer PLN1 on a side of the source electrode S and the drain electrode D away from the base substrate BS, a relay electrode RE on a side of the first planarization layer PLN1 away from the base substrate BS, a second planarization layer PLN2 on a side of the relay electrode RE away from the base substrate BS, an anode AD on a side of the second planarization layer PLN2 away from the base substrate BS, a pixel definition layer PDL on a side of the anode AD away from the base substrate BS, a light emitting layer EL in a respective aperture defined by the pixel definition layer PDL, a cathode CD on a side of the light emitting layer EL away from the base substrate BS, and an encapsulating layer EN on a side of the cathode CD away from the base substrate BS.

In some embodiments, the encapsulating layer EN includes a first inorganic encapsulating sub-layer CVD1 on the one or more light emitting elements LE, an organic encapsulating sub-layer IJP on a side of the first inorganic encapsulating sub-layer CVD1 away from the one or more light emitting elements LE, and a second inorganic encapsulating sub-layer CVD2 on a side of the organic encapsulating sub-layer IJP away from the first inorganic encapsulating sub-layer CVD1.

In some embodiments, at least one layer of the display substrate in the respective island are absent in the respective gap of the plurality of gaps G. Optionally, all layers other than the base substrate BS and the glass plate GL are at least partially absent in the respective gap.

In some embodiments, at least in the respective bridge, the display substrate includes a base substrate BS, a plurality of signal lines SGL on the base substrate BS, and one or more insulating material layers on the base substrate BS. In one example, the display substrate in the respective bridge includes a base substrate BS, a first planarization layer PLN1 on the base substrate BS, a second planarization layer PLN2 on a side of the first planarization layer PLN1 away from the base substrate BS, and a pixel definition layer PDL on a side of the second planarization layer PLN2 away from the base substrate BS. In another example, at least one of the plurality of signal line SGL is on a side of the first planarization layer PLN1 closer to the base substrate BS, at least one of the plurality of signal line SGL is on a side of the first planarization layer PLN1 away from the base substrate BS and on a side of the second planarization layer PLN2 closer to the first planarization layer PLN1, and at least one of the plurality of signal line SGL is on a side of the second planarization layer PLN2 away from the base substrate BS and on a side of the pixel definition layer PDL closer to the second planarization layer PLN2.

In some embodiments, the display substrate includes a stacked structure comprising a plurality of insulating layers between the base substrate BS and the first inorganic encapsulating sub-layer CVD1. In some embodiments, an orthographic projection of the first inorganic encapsulating sub-layer CVD1 on the base substrate BS covers an orthographic projection of each of the plurality of insulating layers in the stacked structure on the base substrate BS. Optionally, at least a portion of the first inorganic encapsulating sub-layer CVD1 is in direct contact with the base substrate BS, thereby encapsulating the stacked structure.

In some embodiments, in a cross-section along a plane perpendicular to the base substrate and intersecting the plurality of insulating layers in the stacked structure (e.g., the cross-section depicted in FIG. 8), any of the plurality of insulating layers are completely unexposed. In some embodiments, in the cross-section, outermost edges of the plurality of insulating layer are encapsulated by the first inorganic encapsulating sub-layer CVD1, thereby rendering the edges of the plurality of insulating layer unexposed.

In some embodiments, an orthographic projection of the second inorganic encapsulating sub-layer CVD2 on the base substrate BS covers an orthographic projection of the first inorganic encapsulating sub-layer CVD1 on the base substrate BS. Optionally, at least a portion of the second inorganic encapsulating sub-layer CVD2 is in direct contact with the base substrate BS, thereby encapsulating the first inorganic encapsulating sub-layer CVD1.

In some embodiments, in a cross-section along a plane perpendicular to the base substrate and intersecting the plurality of insulating layers in the stacked structure (e.g., the cross-section depicted in FIG. 8), an outermost edge of the first inorganic encapsulating sub-layer CVD1 (e.g., an edge of the portion of the first inorganic encapsulating sub-layer CVD1 in direct contact with the base substrate BS) is encapsulated by the second inorganic encapsulating sub-layer CVD2, thereby rendering the outermost edge of the first inorganic encapsulating sub-layer CVD1 unexposed.

Figure 9:
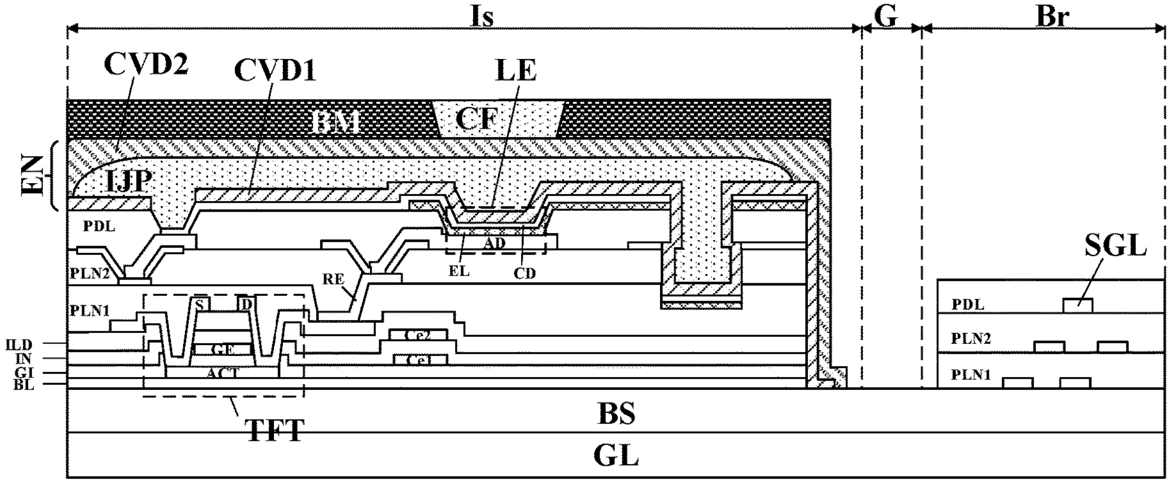
FIG. 9 is a cross-sectional view of a portion of a display substrate in some embodiments according to the present disclosure.

FIG. 9 is a cross-sectional view of a portion of a display substrate in some embodiments according to the present disclosure. FIG. 9 may be a cross-sectional view, e.g., along an A-A' line in FIG. 2. Referring to FIG. 9, the display substrate in some embodiments further includes a black matrix BM and a color filter CF on a side of the encapsulating layer EN away from the base substrate BS. An orthographic projection of the color filter CF on the base substrate BS at least partially overlaps with an orthographic projection of the light emitting element LE on the base substrate BS.

Figure 10:
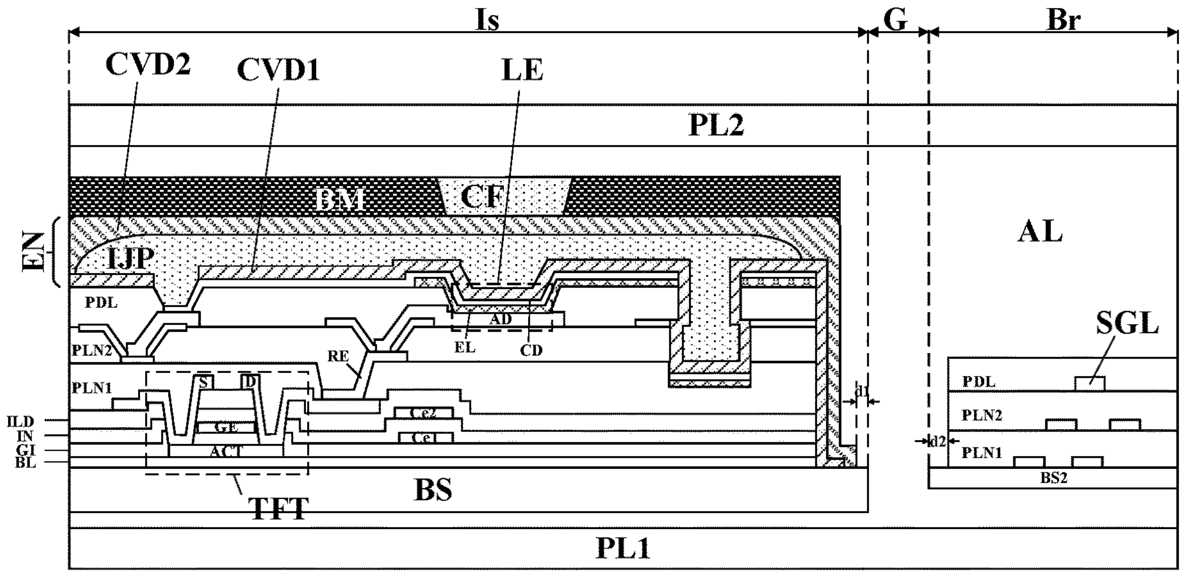
FIG. 10 is a cross-sectional view of a portion of a display substrate in some embodiments according to the present disclosure.

FIG. 10 is a cross-sectional view of a portion of a display substrate in some embodiments according to the present disclosure. Referring to FIG. 10, The display substrate in some embodiments further includes a first protection layer PL1, an adhesive layer AL, and a second protection layer PL2. The glass plate GL in FIG. 9 is removed. An adhesive (e.g., an optically clear adhesive material) is applied to the plurality of gaps G. A first protection layer PL1 and a second protection layer PL2 are provided on two sides of the display substrate. The first protection layer PL1 and the second protection layer PL2 may be made of a low modulus and/or high elasticity material, such as polyurethane (e.g., thermoplastic polyurethane) and polydimethulsiloxane.

In some embodiments, a thickness of a portion of the base substrate in the respective bridge of the display substrate is reduced, e.g., by photolithography (e.g., etching) or laser selective ablation, thereby forming a second base substrate BS2 in the respective bridge. A thickness of the second base substrate BS2 is less than a thickness of the base substrate BS in the respective island. With the reduced thickness of the second base substrate BS2 in the respective bridge, the respective bridge has a higher stretchability.

In some embodiments, in a cross-section along a plane perpendicular to the base substrate and intersecting the plurality of insulating layers in the stacked structure (e.g., the cross-section depicted in FIG. 10), an outermost edge of the second inorganic encapsulating sub-layer CVD2 in the respective island is spaced apart from an outermost edge of the base substrate BS in the respective island along the respective gap of the plurality of gaps G by a distance d1, wherein d1>0. Optionally, d1 is equal to or greater than 0.1 μm, e.g., equal to or greater than 0.2 μm, equal to or greater than 0.3 μm, equal to or greater than 0.4 μm, equal to or greater than 0.5 μm, equal to or greater than 0.6 μm, equal to or greater than 0.7 μm, equal to or greater than 0.8 μm, equal to or greater than 0.9 μm, equal to or greater than 1.0 μm, equal to or greater than 1.1 μm, equal to or greater than 1.2 μm, equal to or greater than 1.3 μm, equal to or greater than 1.4 μm, equal to or greater than 1.5 μm, equal to or greater than 1.6 μm, equal to or greater than 1.7 μm, equal to or greater than 1.8 μm, equal to or greater than 1.9 μm, equal to or greater than 2.0 μm, equal to or greater than 2.5 μm, equal to or greater than 3.0 μm, equal to or greater than 3.5 μm, equal to or greater than 4.0 μm, equal to or greater than 4.5 μm, equal to or greater than 5.0 μm, equal to or greater than 5.5 μm, equal to or greater than 6.0 μm, equal to or greater than 6.5 μm, equal to or greater than 7.0 μm, equal to or greater than 7.5 μm, equal to or greater than 8.0 μm, equal to or greater than 8.5 μm, equal to or greater than 9.0 μm, equal to or greater than 9.5 μm, or equal to or greater than 10.0 μm. In one example, d1 is equal to or greater than 2.0 μm.

In some embodiments, the display substrate includes a stacked structure comprising a plurality of insulating layers in the respective bridge of the plurality of bridges Br. The plurality of insulating layers are on the second base substrate BS2. In one example as depicted in FIG. 10, the stacked structure includes a first planarization layer PLN1 on the second base substrate BS2, a second planarization layer PLN2 on a side of the first planarization layer PLN1 away from the second base substrate BS2, and a pixel definition layer PDL on a side of the second planarization layer PLN2 away from the second base substrate BS2. In some embodiments, in a cross-section along a plane perpendicular to the second base substrate BS2 and intersecting the plurality of insulating layers in the stacked structure (e.g., the cross-section depicted in FIG. 10), an outermost edge of the stacked structure in the respective bridge (including outermost edges of the plurality of insulating layers in the stacked structure) is spaced apart from an outermost edge of the second base substrate BS2 in the respective bridge along the respective gap of the plurality of gaps G by a distance d2, wherein d2>0. Optionally, d2 is equal to or greater than 0.1 μm, e.g., equal to or greater than 0.2 μm, equal to or greater than 0.3 μm, equal to or greater than 0.4 μm, equal to or greater than 0.5 μm, equal to or greater than 0.6 μm, equal to or greater than 0.7 μm, equal to or greater than 0.8 μm, equal to or greater than 0.9 μm, equal to or greater than 1.0 μm, equal to or greater than 1.1 μm, equal to or greater than 1.2 μm, equal to or greater than 1.3 μm, equal to or greater than 1.4 μm, equal to or greater than 1.5 μm, equal to or greater than 1.6 μm, equal to or greater than 1.7 μm, equal to or greater than 1.8 μm, equal to or greater than 1.9 μm, equal to or greater than 2.0 μm, equal to or greater than 2.5 μm, equal to or greater than 3.0 μm, equal to or greater than 3.5 μm, equal to or greater than 4.0 μm, equal to or greater than 4.5 μm, equal to or greater than 5.0 μm, equal to or greater than 5.5 μm, equal to or greater than 6.0 μm, equal to or greater than 6.5 μm, equal to or greater than 7.0 μm, equal to or greater than 7.5 μm, equal to or greater than 8.0 μm, equal to or greater than 8.5 μm, equal to or greater than 9.0 μm, equal to or greater than 9.5 μm, or equal to or greater than 10.0 μm. In one example, d2 is equal to or greater than 2.0 μm.

The inventors of the present disclosure discover that, by having the margin d1, a tensile stress applied to the respective island during a stretching process can be significantly reduced.

The inventors of the present disclosure discover that, by having the margin d2, a tensile stress applied to the respective bridge during a stretching process can be significantly reduced.

Figure 11A:
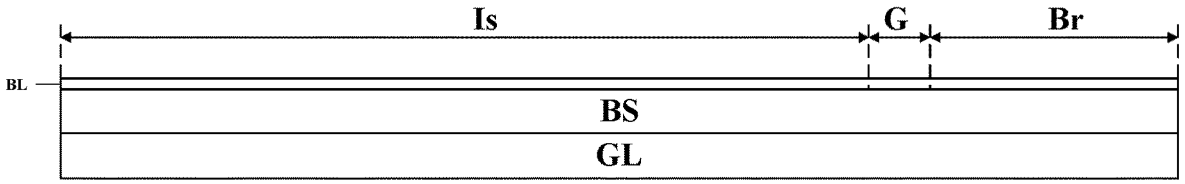
FIG. 11A to FIG. 11S illustrate a process of fabricating a display substrate in some embodiments according to the present disclosure.
Figure 11B:
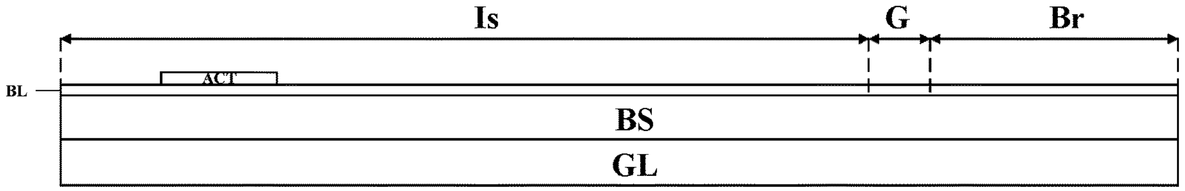
Figure 11C:
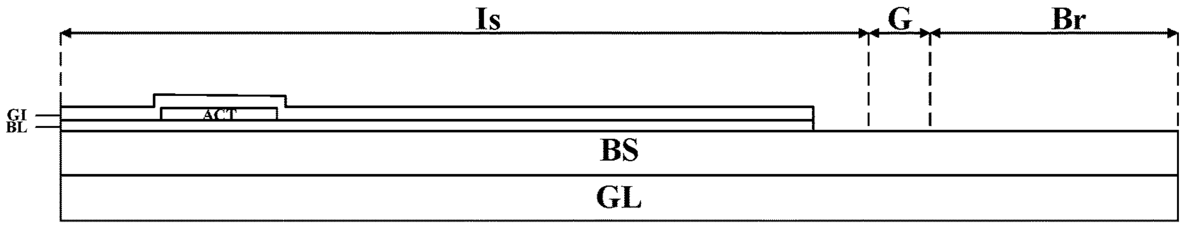
Figure 11D:
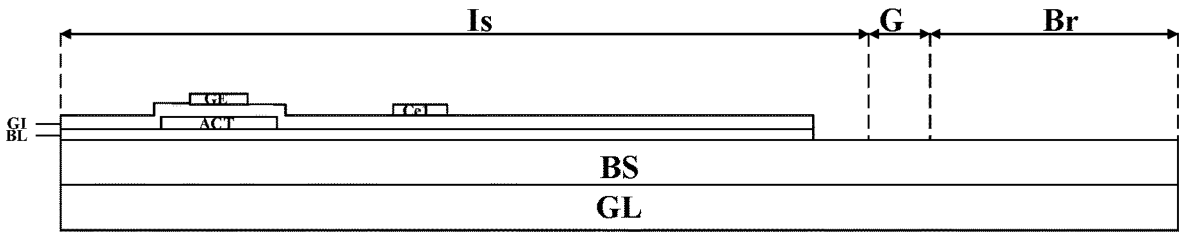
Figure 11E:
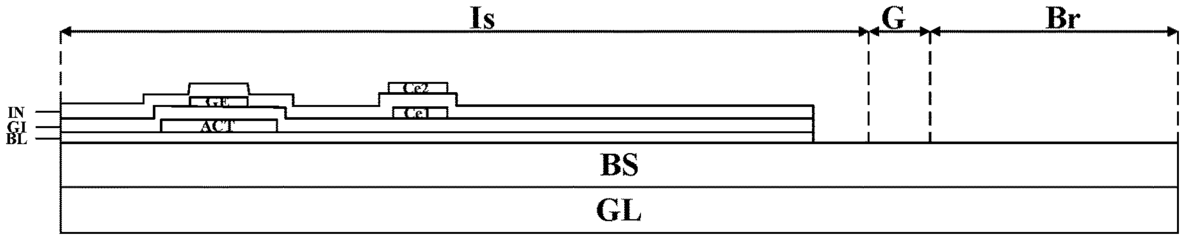
Figure 11F:
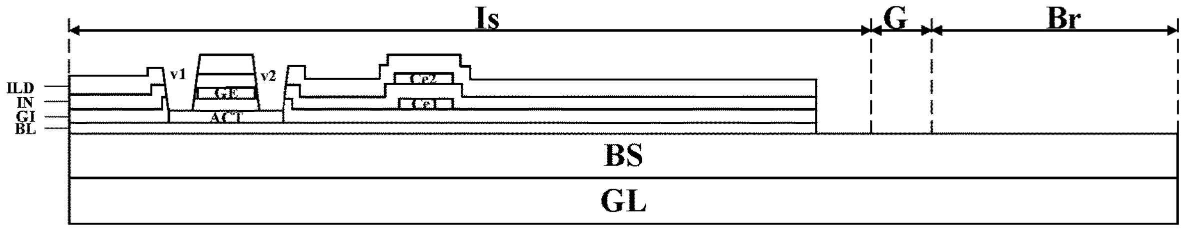
Figure 11G:
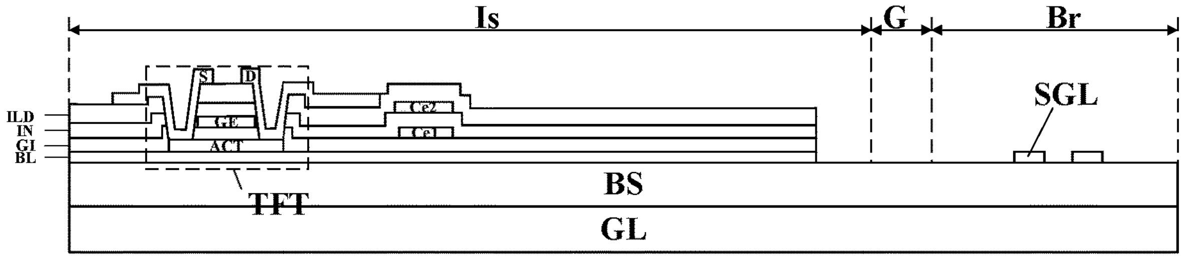
Figure 11H:
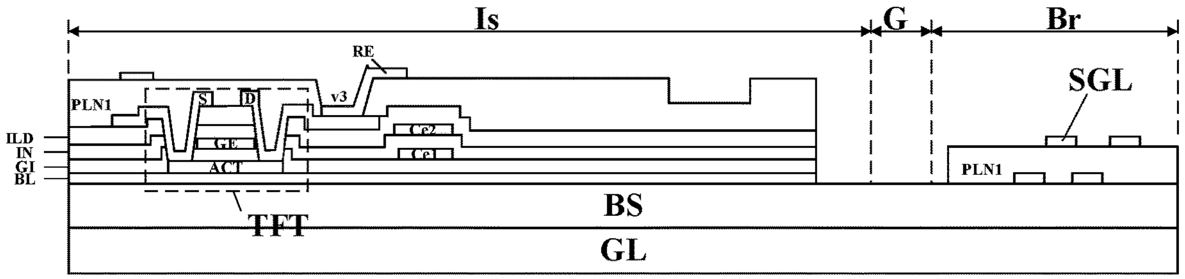
Figure 11I:
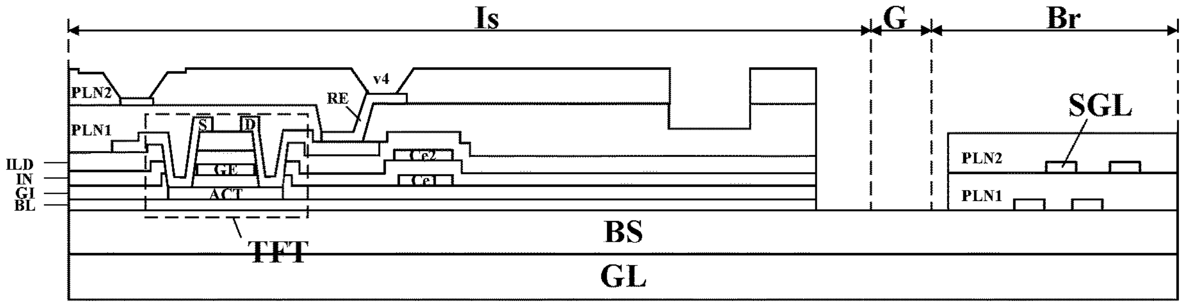
Figure 11J:
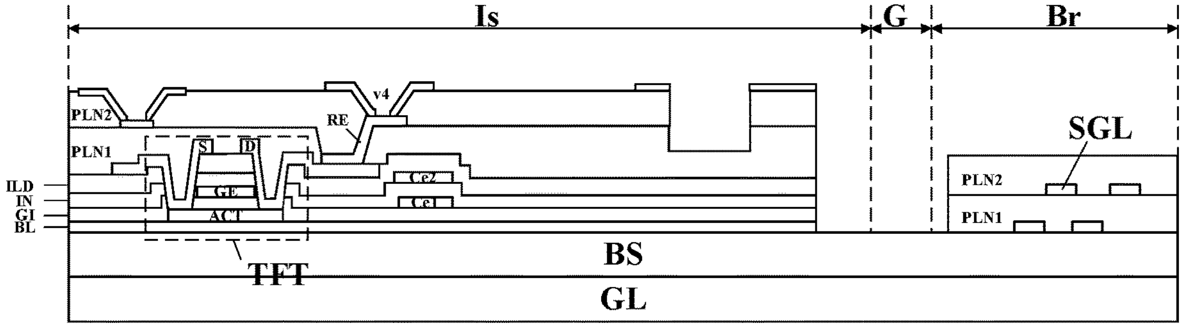
Figure 11K:
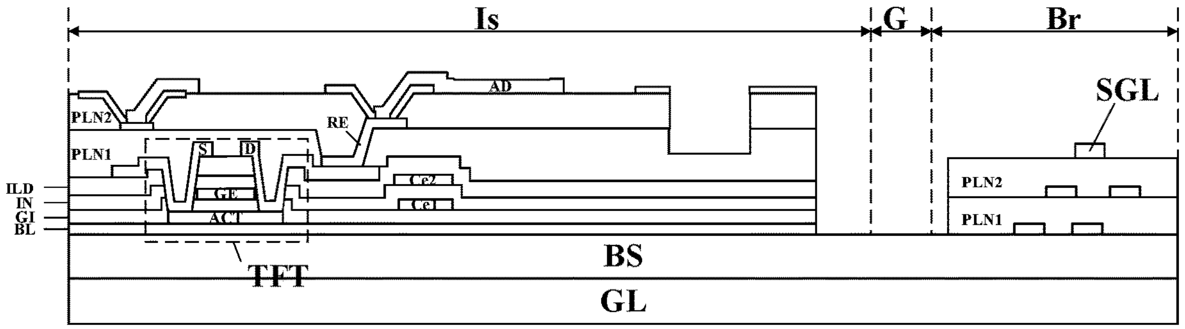
Figure 11L:
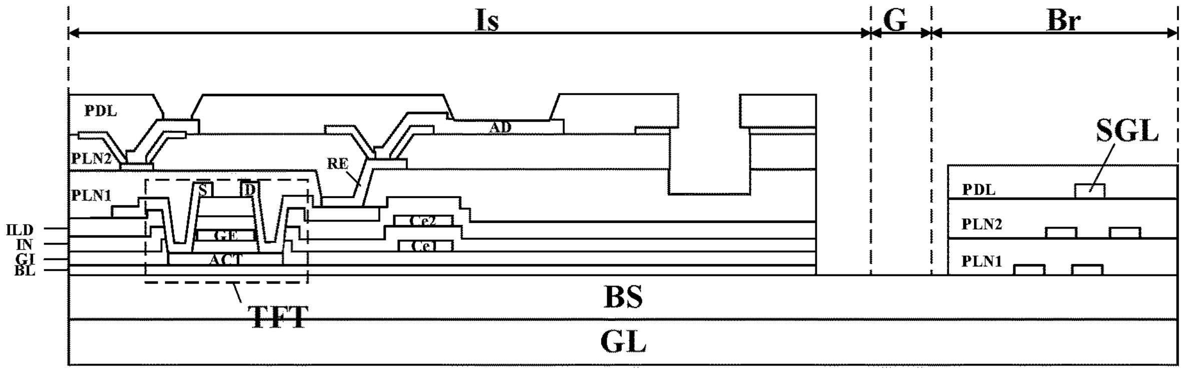
Figure 11M:
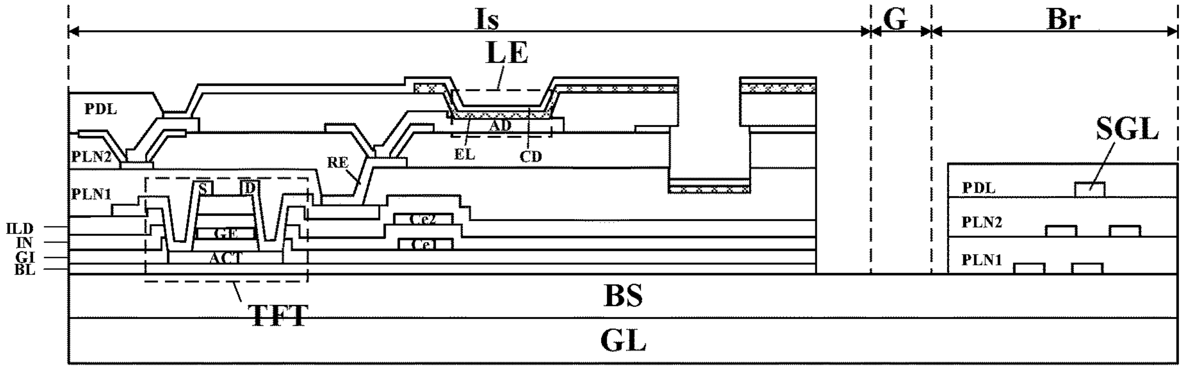
Figure 11N:
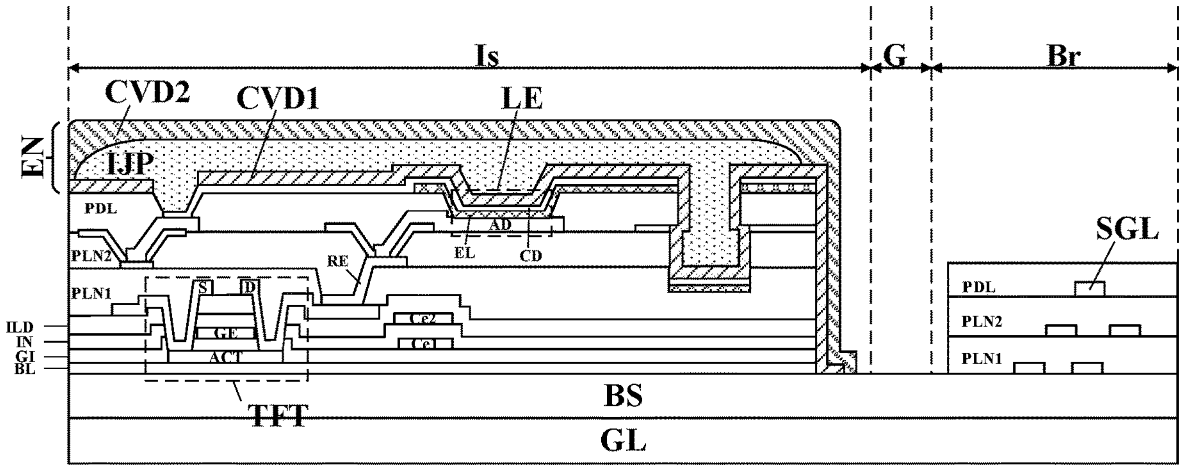
Figure 11O:
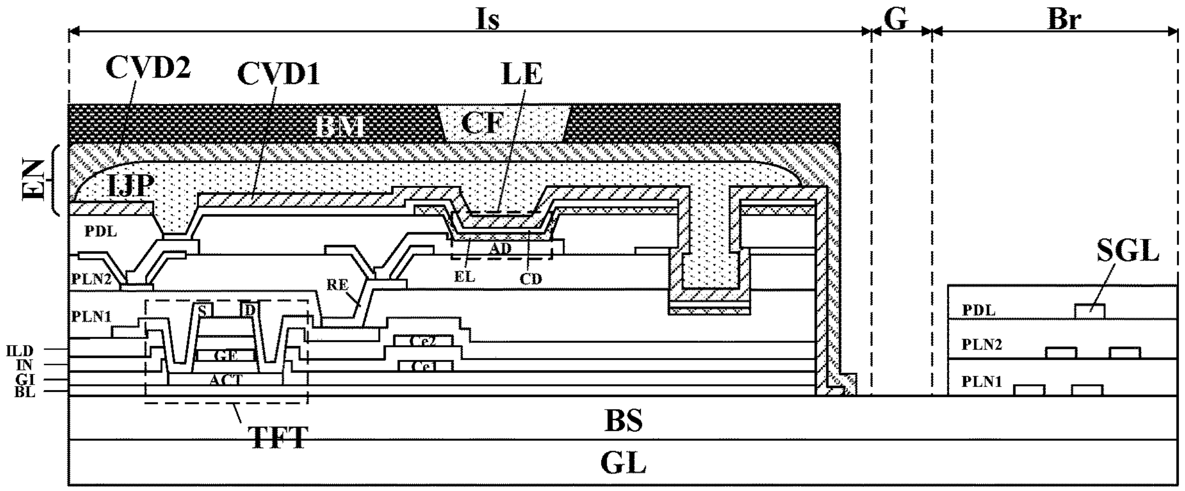
Figure 11P:
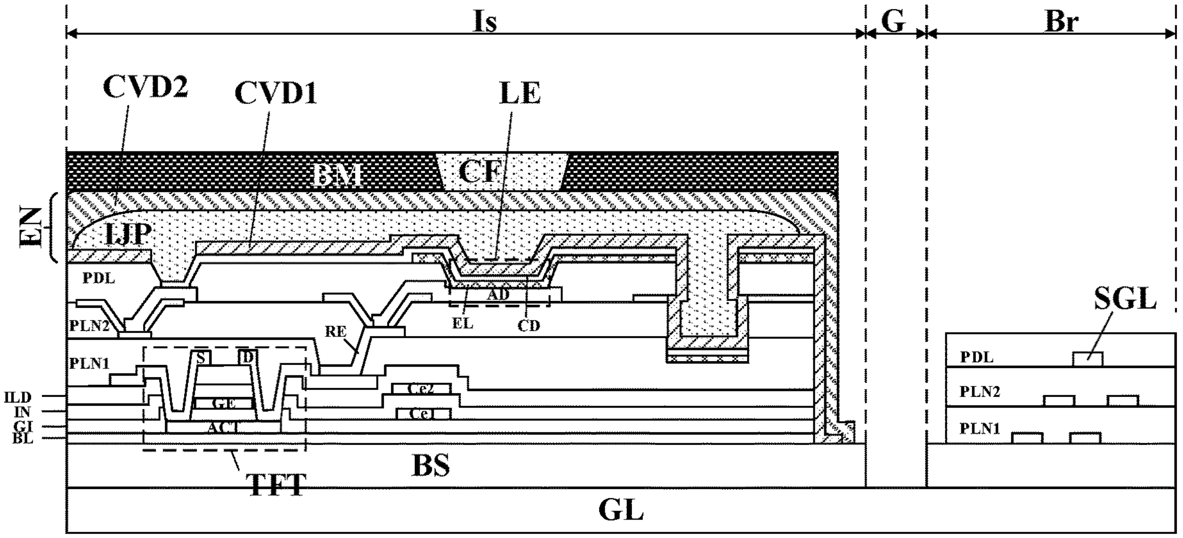
Figure 11Q:
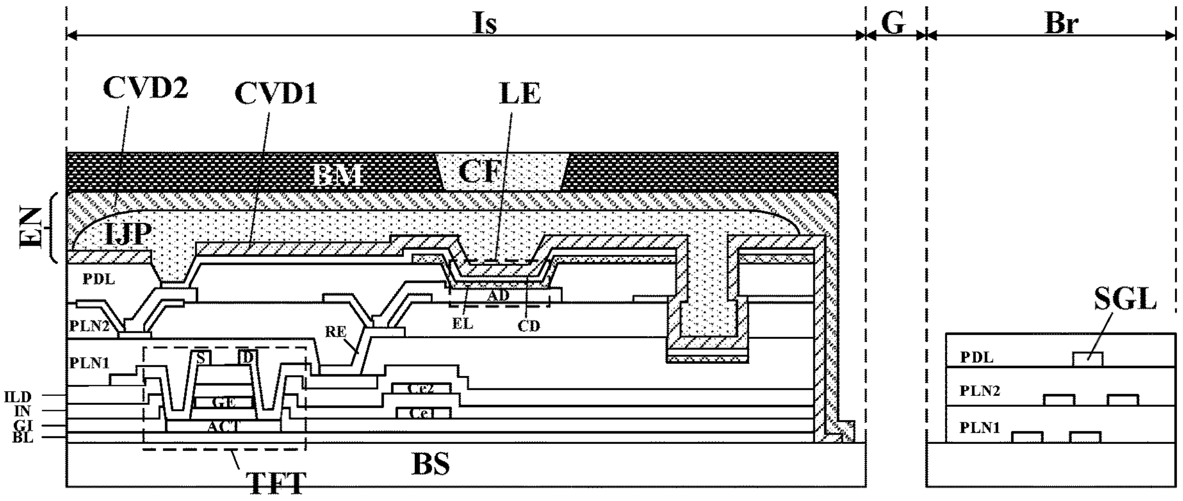
Figure 11R:
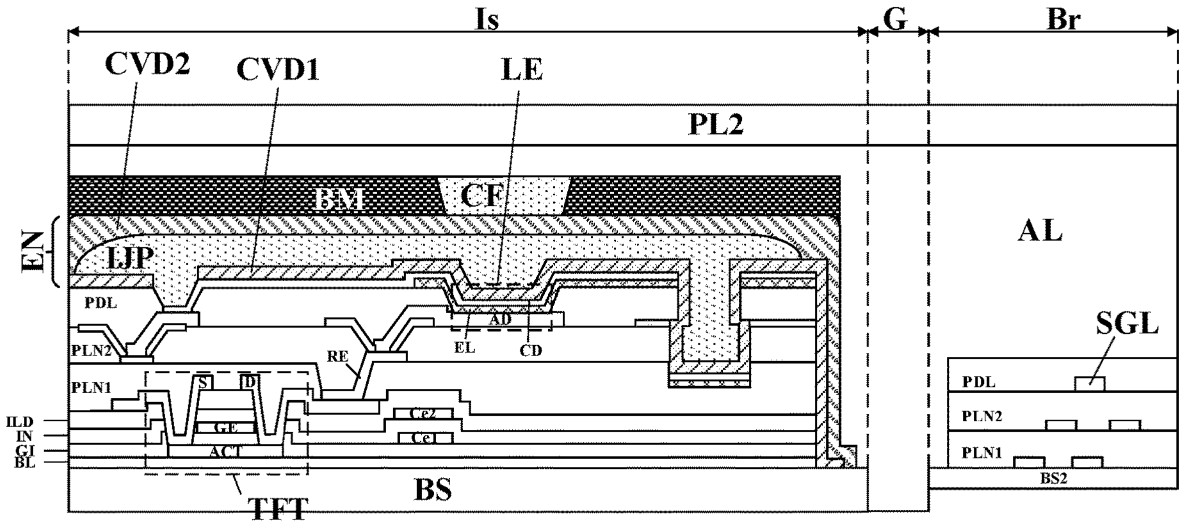
Figure 11S:
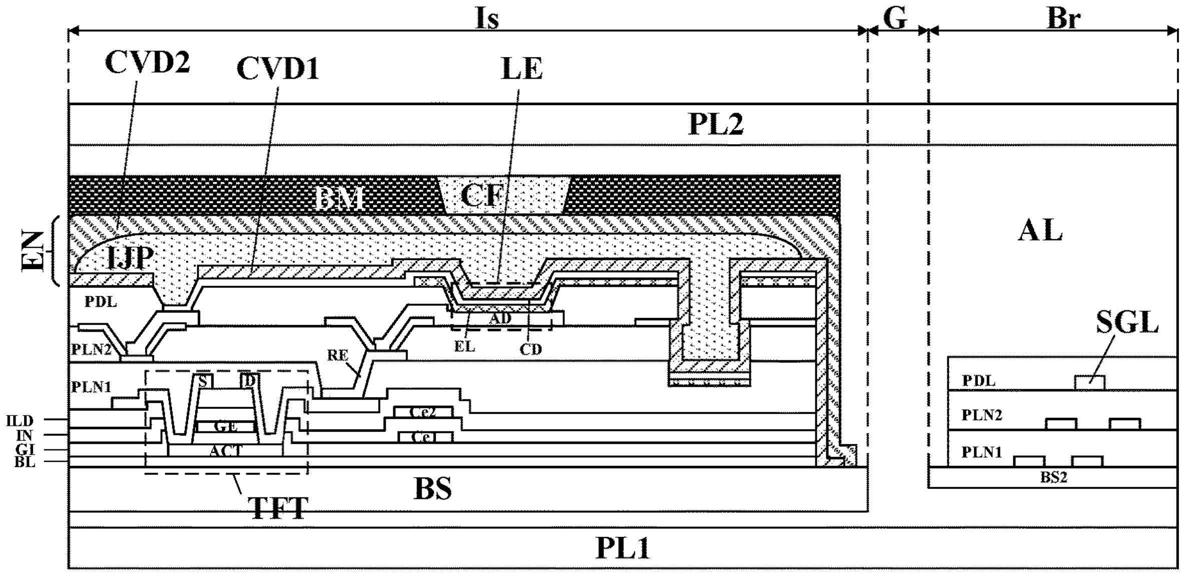

FIG. 11A to FIG. 11S illustrate a process of fabricating a display substrate in some embodiments according to the present disclosure. Referring to FIG. 11A, a base substrate BS (e.g., polyimide) is formed on a glass plate GL, and a barrier layer BL is formed on a side of the base substrate BS away from the glass plate GL.

Referring to FIG. 11B, an active layer ACT is formed on a side of the barrier layer BL away from the base substrate BS.

Referring to FIG. 11C, a gate insulating layer GI is formed on a side of the active layer ACT and the barrier layer BL away from the base substrate BS. The barrier layer BL and the gate insulating layer GI are patterned to be limited in a region inside the respective island of the plurality of islands Is. Edges of the barrier layer BL and the gate insulating layer GI are spaced apart from a boundary of a respective gap of the plurality of gaps G by a margin.

Referring to FIG. 11D, a gate electrode GE and a first capacitor electrode Ce1 of a storage capacitor are formed on a side of the gate insulating layer GI away from the base substrate BS.

Referring to FIG. 11E, an insulating layer IN is formed on a side of the gate electrode GE and the first capacitor electrode Ce1 away from the base substrate BS, and a second capacitor electrode Ce2 of the storage capacitor is formed on a side of the insulating layer IN away from the base substrate BS.

Referring to FIG. 11F, an inter-layer dielectric layer ILD is formed on a side of the second capacitor electrode Ce2 and the insulating layer IN away from the base substrate BS, and a first via v1 and a second via v2 are formed to extending through the inter-layer dielectric layer ILD, the insulating layer IN, and the gate insulating layer GI, exposing portions of the active layer ACT.

Referring to FIG. 11F and FIG. 11G, a source electrode S and a drain electrode D are formed on a side of the inter-layer dielectric layer ILD away from the base substrate BS. The source electrode S and the drain electrode D connect to the active layer ACT through the first via v1 and the second via v2, respectively. In the respective bridge, one or more signal lines are formed on the base substrate BS.

Referring to FIG. 11H, a first planarization layer PLN1 is formed on a side of the source electrode S and the drain electrode D away from the base substrate BS, a third via v3 is formed to extend through the first planarization layer PLN1, and a relay electrode RE is formed on a side of the first planarization layer PLN1 away from the base substrate BS. The relay electrode RE connects to the drain electrode D through the third via v3. In the respective bridge, one or more signal lines are formed on a side of the first planarization layer PLN1 away from the base substrate BS.

Referring to FIG. 11I, a second planarization layer PLN2 is formed on a side of the relay electrode RE away from the base substrate BS, a fourth via v4 is formed to extend through the second planarization layer PLN2, exposing a portion of the relay electrode RE. In the respective bridge, the second planarization layer PLN2 is also formed to cover the one or more signal lines.

Referring to FIG. 11J, at least a first sub-layer of an anode (e.g., a metallic sub-layer) is formed on a side of the second planarization layer PLN2 away from the base substrate BS, the first sub-layer connects to the relay electrode RE through the fourth via v4.

Referring to FIG. 11K, at least a second sub-layer of the anode is formed on a side of the first sub-layer away from the base substrate BS, there by forming the anode AD. The second sub-layer connects to the first sub-layer. In the respective bridge, one or more signal lines are formed on a side of the second planarization layer PLN2 away from the base substrate BS.

Referring to FIG. 11L, a pixel definition layer PDL is formed on a side of the anode AD away from the base substrate BS, defining a respective aperture of a plurality of apertures for receiving light emitting materials. In the respective bridge, the pixel definition layer PDL is also formed to cover the one or more signal lines.

Referring to FIG. 11M, a light emitting layer EL is formed on a side of the anode AD away from the base substrate BS, and a cathode CD is formed on a side of the light emitting layer EL away from the base substrate BS, thereby forming a light emitting element LE.

Referring to FIG. 11N, an encapsulating layer EN is formed to encapsulate the light emitting element LE. In some embodiments, a first inorganic encapsulating sub-layer CVD1 is formed on a side of the cathode CD away from the base substrate BS, an organic encapsulating sub-layer IJP is formed on a side of the first inorganic encapsulating sub-layer CVD1 away from the base substrate BS, and a second inorganic encapsulating sub-layer CVD2 is formed on a side of the organic encapsulating sub-layer IJP away from the base substrate BS.

Referring to FIG. 11O, a black matrix BM and a color filter CF are formed on a side of the encapsulating layer EN away from the base substrate BS. An orthographic projection of the color filter CF on the base substrate BS at least partially overlaps with an orthographic projection of the light emitting element LE on the base substrate BS.

Referring to FIG. 11P, the base substrate BS is patterned to remove a portion between the components of the respective island and components of the respective bridge, thereby forming the respective gap. Optionally, in the respective gap, the portion of the base substrate BS is completely removed.

Referring to FIG. 11Q, the glass plate GL is removed, e.g., by a laser peeling process.

Referring to FIG. 11R, an adhesive (e.g., an optically clear adhesive material) is applied to the plurality of gaps G, thereby forming an adhesive layer AL. A second protection layer PL2 is provided on a light emitting side of the display substrate to provide protection. a thickness of a portion of the base substrate in the respective bridge of the display substrate is reduced, e.g., by photolithography (e.g., etching) or laser selective ablation, thereby forming a second base substrate BS2 in the respective bridge.

Referring to FIG. 11S, a first protection layer PL1 is provided on a side of the base substrate BS and the second base substrate BS2 away from the second protection layer PL2 to provide protection.

Figure 12:
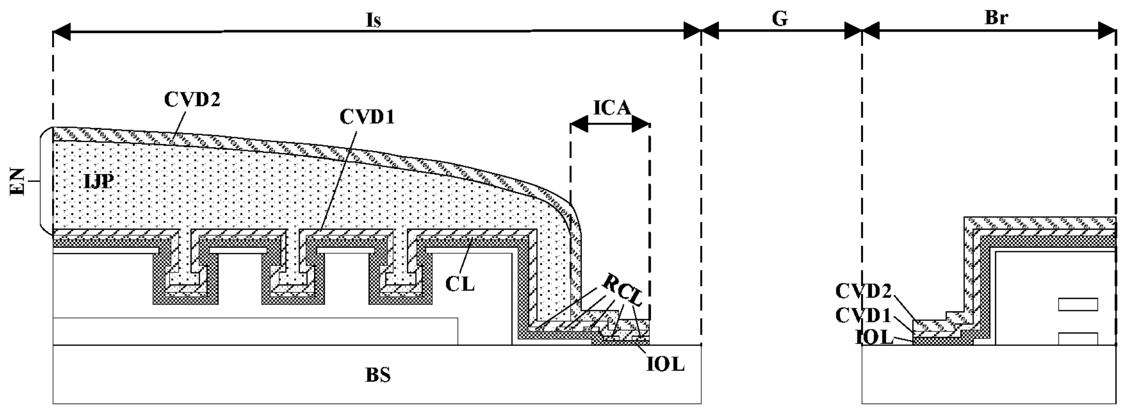
FIG. 12 is a cross-sectional view of a portion of a display substrate in some embodiments according to the present disclosure.

The inventors of the present disclosure further discover that a residual organic material accumulated during a deposition of one or more common layers can adversely affect the encapsulation of the respective island. The one or more common layers may include, for example, a cathode layer, a hole transport layer, a hole injection layer, an electron transport layer, and an electron injection layer. FIG. 12 is a cross-sectional view of a portion of a display substrate in some embodiments according to the present disclosure. Referring to FIG. 12, the display substrate in some embodiments includes a plurality of Islands Is, a plurality of gaps G, and a plurality of bridges Br. In some embodiments, the plurality of Islands Is are a plurality of encapsulated islands. The display substrate includes an encapsulating layer EN on a side of one or more light emitting elements in the respective island away from a base substrate BS, encapsulating the one or more light emitting elements.

In some embodiments, the encapsulating layer EN includes a first inorganic encapsulating sub-layer CVD1 on the one or more light emitting elements LE, an organic encapsulating sub-layer IJP on a side of the first inorganic encapsulating sub-layer CVD1 away from the one or more light emitting elements LE, and a second inorganic encapsulating sub-layer CVD2 on a side of the organic encapsulating sub-layer IJP away from the first inorganic encapsulating sub-layer CVD1.

In some embodiments, the display substrate includes a stacked structure comprising a plurality of insulating layers between the base substrate BS and the first inorganic encapsulating sub-layer CVD1. In some embodiments, the plurality of insulating layers includes an inorganic insulating layer IOL. The inorganic insulating layer IOL may be any one of a gate insulating layer, an insulating layer, an inter-layer dielectric layer, a planarization layer (e.g., a first planarization layer or a second planarization layer), a passivation layer (e.g., a first passivation layer or a second passivation layer), or any combination thereof. In one example, the inorganic insulating layer IOL is the second passivation layer.

In some embodiments, the display substrate in an inorganic layer contact area ICA includes a stacked structure comprising the inorganic insulating layer IOL on the base substrate BS, the first inorganic encapsulating sub-layer CVD1 on a side of the inorganic insulating layer IOL away from the base substrate BS, and the second inorganic encapsulating sub-layer CVD2 on a side of the first inorganic encapsulating sub-layer CVD1 away from the base substrate BS. The stacked structure in the inorganic layer contact area ICA encapsulates the one or more light emitting elements in the respective island.

In some embodiments, the organic encapsulating sub-layer IJP does not extend into the inorganic layer contact area ICA. In the inorganic layer contact area ICA, the first inorganic encapsulating sub-layer CVD1 is in direct contact with the second inorganic encapsulating sub-layer CVD2.

In some embodiments, the display substrate includes a common layer CL. The common layer CL may be an organic material layer in the one or more light emitting elements. Examples of common layers include a hole transport layer, a hole injection layer, an electron transport layer, and an electron injection layer. Optionally, the common layer CL may further include a cathode layer. An orthographic projection of the common layer CL on the base substrate BS at least partially overlaps with an orthographic projection of the organic encapsulating sub-layer IJP on the base substrate BS.

In some embodiments, the display substrate further includes a residual common layer RCL at least partially in the inorganic layer contact area ICA. The residual common layer RCL is on a side of the inorganic insulating layer IOL away from the base substrate BS, and is on a side of the first inorganic encapsulating sub-layer CVD1 away from the second inorganic encapsulating sub-layer CVD2. The inventors of the present disclosure discover that the presence of the residual common layer RCL adversely affects the encapsulation of the respective island.

Figure 13A:
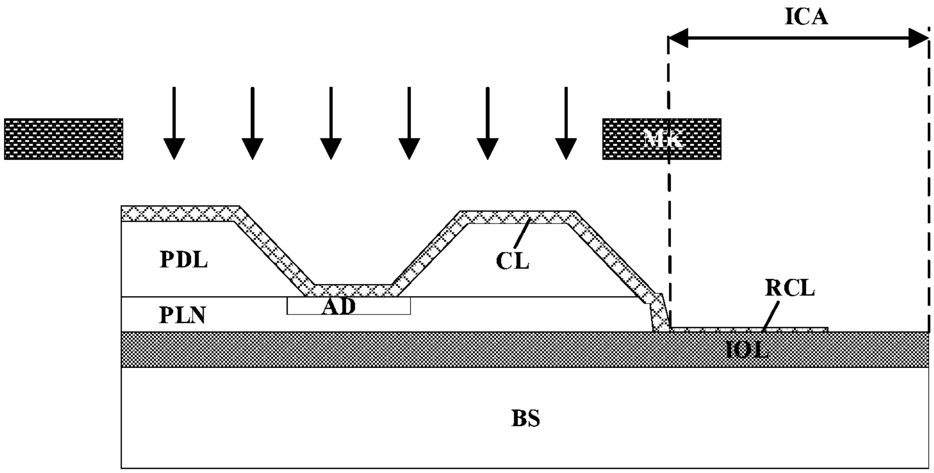
FIG. 13A to FIG. 13E illustrate a process of fabricating a display substrate in some embodiments according to the present disclosure.

Accordingly, the inventors of the present disclosure discover a novel structure and fabricating process that obviate the defects in the encapsulation of the respective island. FIG. 13A to FIG. 13E illustrate a process of fabricating a display substrate in some embodiments according to the present disclosure. Referring to FIG. 13A, in the respective island, an inorganic insulating layer IOL is formed on the base substrate BS. Optionally, a planarization layer PLN is formed on a side of the inorganic insulating layer IOL away from the base substrate BS, an anode AD is formed on a side of the planarization layer PLN away from the base substrate BS, a pixel definition layer PDL is formed on a side of the anode AD away from the base substrate BS, and a common layer CL is formed on a side of the pixel definition layer PDL and the anode AD away from the base substrate BS. The common layer CL in some embodiments is formed by depositing a common layer material (e.g., an organic functional material) using a mask plate MK. Although an aperture of the mask plate MK is at least partially outside of the inorganic layer contact area ICA, the common layer material is still deposited at least partially in the inorganic layer contact area ICA by shadowing effect, thereby forming a residual common layer RCL.

Figure 13B:
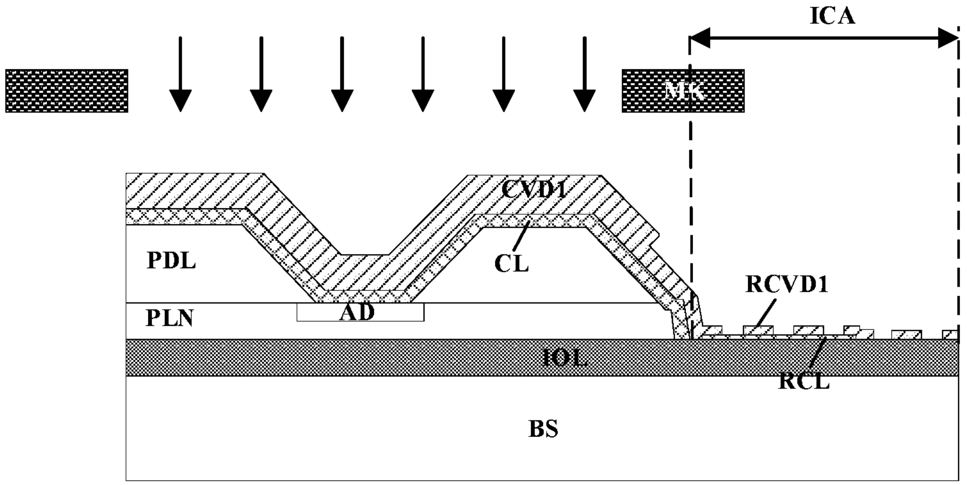

Referring to FIG. 13B, a first inorganic encapsulating sub-layer CVD1 is formed on a side of the common layer CL away from the base substrate BS by depositing an encapsulating material using a mask plate MK. Although an aperture of the mask plate MK is at least partially outside of the inorganic layer contact area ICA, the encapsulating material is still deposited at least partially in the inorganic layer contact area ICA by shadowing effect, thereby forming a residual first inorganic encapsulating sub-layer RCVD1.

Figure 13C:
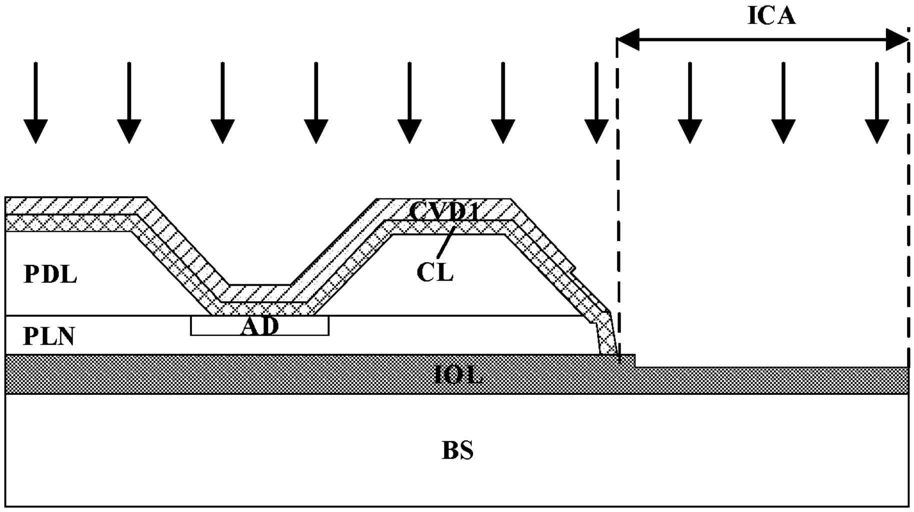

As discussed above, the presence of the residual common layer RCL and/or the residual first inorganic encapsulating sub-layer RCVD1 adversely affects the encapsulation of the respective island. Referring to FIG. 13C, the residual common layer RCL is removed from the inorganic layer contact area ICA, thereby providing a clean inorganic surface for receiving the second inorganic encapsulating sub-layer CVD2. In some embodiments, removing the residual common layer RCL includes performing an etching process on the substrate. Subsequent to the etching process, the residual common layer RCL and/or the residual first inorganic encapsulating sub-layer RCVD1 are removed. Optionally, a thickness of at least a portion of the first inorganic encapsulating sub-layer CVD1 is reduced. Optionally, a thickness of a portion of the inorganic insulating layer IOL in the inorganic layer contact area ICA is reduced. Optionally, the etching process is a dry etching process.

In one example, the thickness of at least a portion of the first inorganic encapsulating sub-layer CVD1 is reduced to at least ⅓ of an initial thickness prior to the etching process.

In some embodiments, an average thickness of a portion of the inorganic insulating layer in the inorganic layer contact area is less than an average thickness of a portion of the inorganic insulating layer outside the inorganic layer contact area and in the respective island. Optionally, the average thickness of a portion of the inorganic insulating layer in the inorganic layer contact area is less than the average thickness of a portion of the inorganic insulating layer outside the inorganic layer contact area and in the respective island by at least 1%, e.g., by at least 2%, by at least 3%, by at least 4%, by at least 5%, by at least 6%, by at least 7%, by at least 8%, by at least 9%, by at least 10%, by at least 15%, by at least 20%, by at least 25%, by at least 30%, by at least 35%, by at least 40%, by at least 45%, by at least 50%, by at least 55%, or by at least 60%.

In some embodiments, subsequent to removing the residual common layer RCL, the inorganic layer contact area ICA is substantially free of any organic material. As used herein, the term "substantially free" refers to at least 90% (e.g., at least 91%, at least 92%, at least 93%, at least 94%, at least 95%, at least 96%, at least 97%, at least 98%, at least 99%, or 100%) of the surface of a portion of the inorganic insulating layer IOL in the inorganic layer contact area ICA is absent of any organic material.

In some embodiments, subsequent to removing the residual common layer RCL, the inorganic layer contact area ICA is substantially free of the residual first inorganic encapsulating sub-layer RCVD1.

Figure 13D:
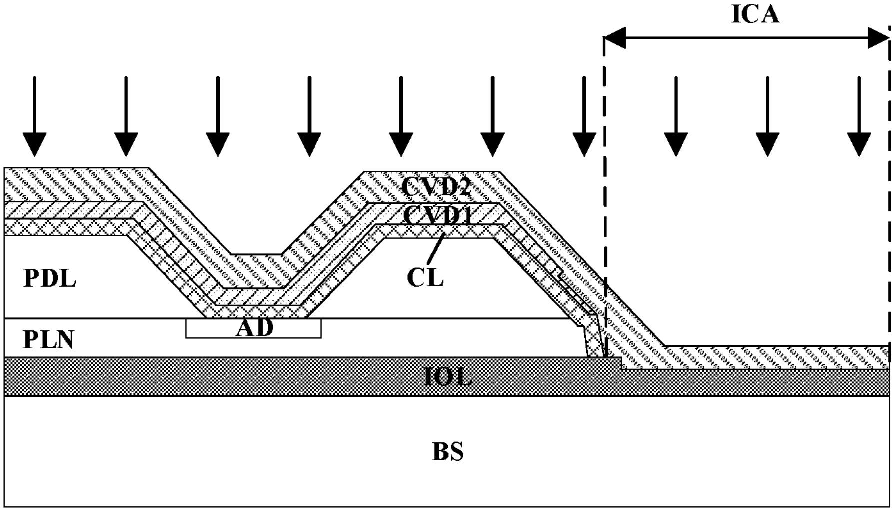

Referring to FIG. 13D, a second inorganic encapsulating sub-layer CVD2 is formed on a side of the first inorganic encapsulating sub-layer CVD1 away from the base substrate BS. In the inorganic layer contact area ICA, the second inorganic encapsulating sub-layer CVD2 is formed on the clean surface of the inorganic insulating layer IOL, greatly enhancing the encapsulation effectiveness.

Figure 13E:
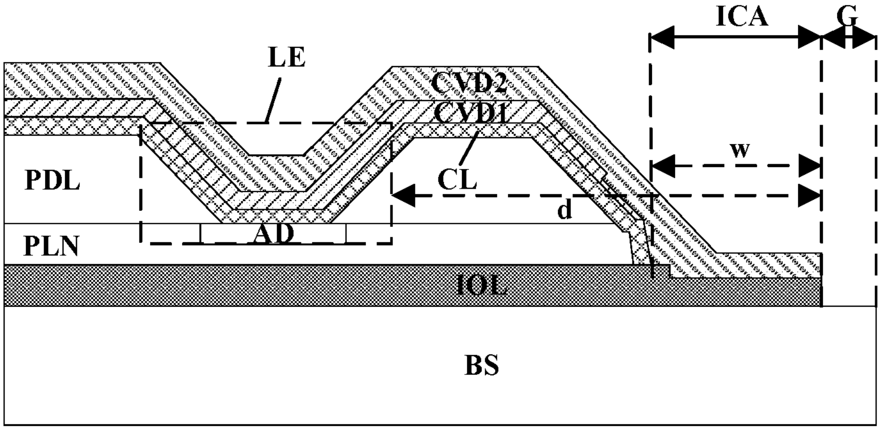

Referring to FIG. 13E, a portion of the second inorganic encapsulating sub-layer CVD2 and a portion of the inorganic insulating layer IOL in the inorganic layer contact area ICA are removed (e.g., by lithography patterning), thereby forming a respective gap of the plurality of gaps G.

Because the display substrate according to the present disclosure has a significantly enhanced encapsulation effectiveness, the respective island can have a relatively narrow inorganic layer contact area. In some embodiments, in a cross-section along a plane perpendicular to the base substrate and intersecting the inorganic insulating layer IOL, the first inorganic encapsulating sub-layer CVD1, and the second inorganic encapsulating sub-layer CVD2 (e.g., the cross-section depicted in FIG. 13E), the inorganic layer contact area ICA has an average width w. Optionally, w is less than 10 μm, e.g., less than 9 μm, less than 8 μm, less than 7 μm, less than 6 μm, less than 5 μm, or less than 4 μm. In one example, w is less than 5 μm.

In some embodiments, in a cross-section along a plane perpendicular to the base substrate and intersecting the inorganic insulating layer IOL, the first inorganic encapsulating sub-layer CVD1, and the second inorganic encapsulating sub-layer CVD2 (e.g., the cross-section depicted in FIG. 13E), a respective light emitting element LE in the respective island that is closest to the respective gap of the plurality of gaps has an average distance d to the respective gap. Optionally, d is less than 30 μm, e.g., less than 28 μm, less than 26 μm, less than 24 μm, less than 22 μm, or less than 20 μm less than 18 μm, less than 16 μm, less than 14 μm, less than 12 μm, or less than 10 μm. In one example, d is less than 20 μm.

In some embodiments, an orthographic projection of the second inorganic encapsulating sub-layer CVD2 on the base substrate BS covers an orthographic projection of the first inorganic encapsulating sub-layer CVD1 on the base substrate BS. Optionally, at least a portion of the second inorganic encapsulating sub-layer CVD2 is in direct contact with the inorganic insulating layer IOL, thereby encapsulating the first inorganic encapsulating sub-layer CVD1.

In some embodiments, in a cross-section along a plane perpendicular to the base substrate and intersecting the inorganic insulating layer IOL, the first inorganic encapsulating sub-layer CVD1, and the second inorganic encapsulating sub-layer CVD2 (e.g., the cross-section depicted in FIG. 13E), an outermost edge of the first inorganic encapsulating sub-layer CVD1 (e.g., an edge of the portion of the first inorganic encapsulating sub-layer CVD1 in direct contact with the inorganic insulating layer IOL) is encapsulated by the second inorganic encapsulating sub-layer CVD2, thereby rendering the outermost edge of the first inorganic encapsulating sub-layer CVD1 unexposed.

In some embodiments, the display substrate further includes one or more pillars to further enhance the encapsulation effectiveness in combination with the unique encapsulating structure in the inorganic layer contact area ICA. The inventors of the present disclosure discover that a synergistic effect can be achieved by the combination. Referring to FIG. 7A, the display substrate in some embodiments includes one or more first pillars PLA1 and one or more second pillars PLA2.

Figure 14A:
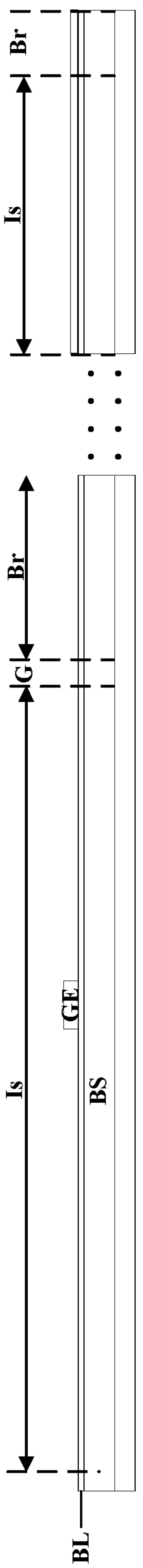
FIG. 14A to FIG. 14O illustrate a process of fabricating a display substrate in some embodiments according to the present disclosure.
Figure 14B:
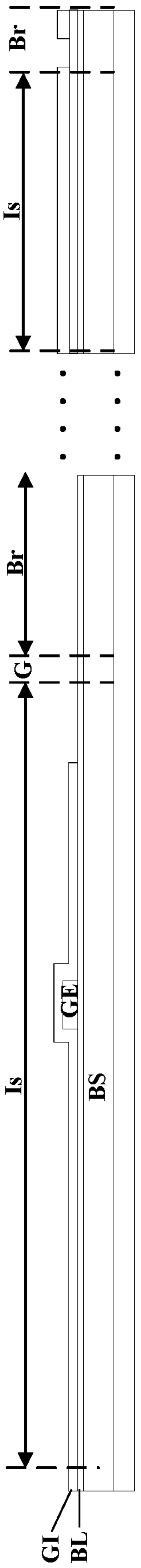
Figure 14C:
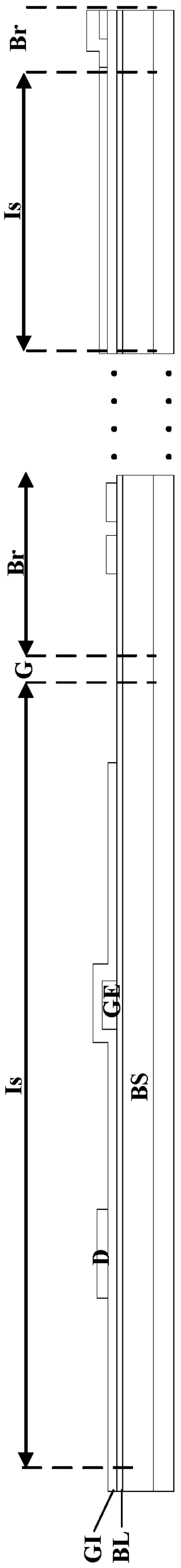
Figure 14D:
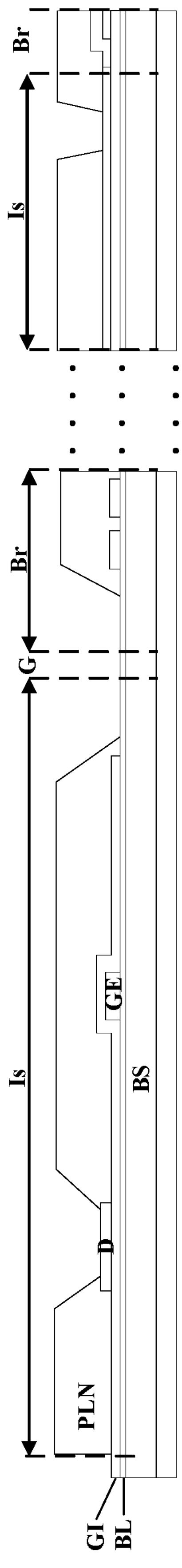
Figure 14E:
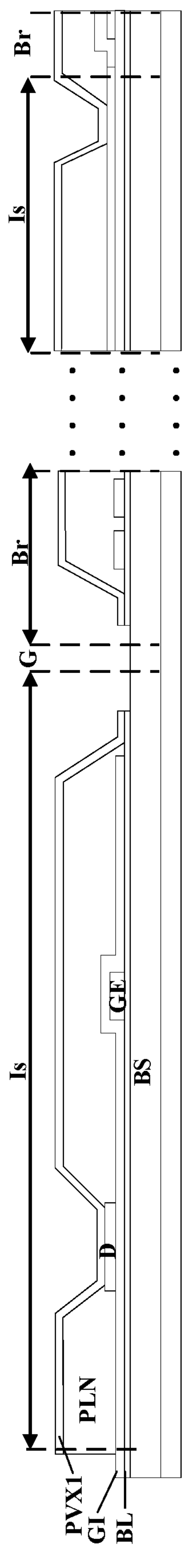
Figure 14F:
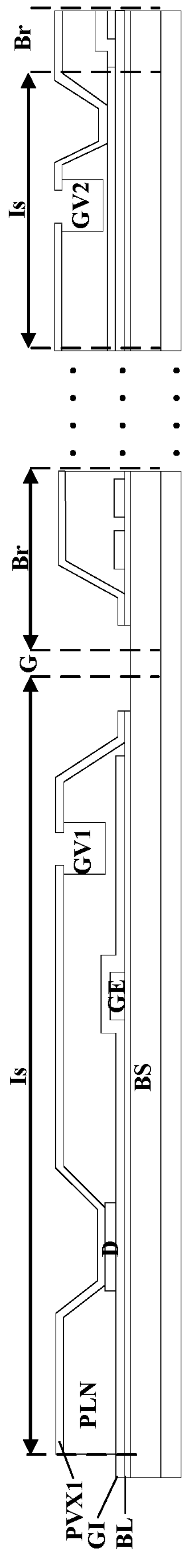
Figure 14G:
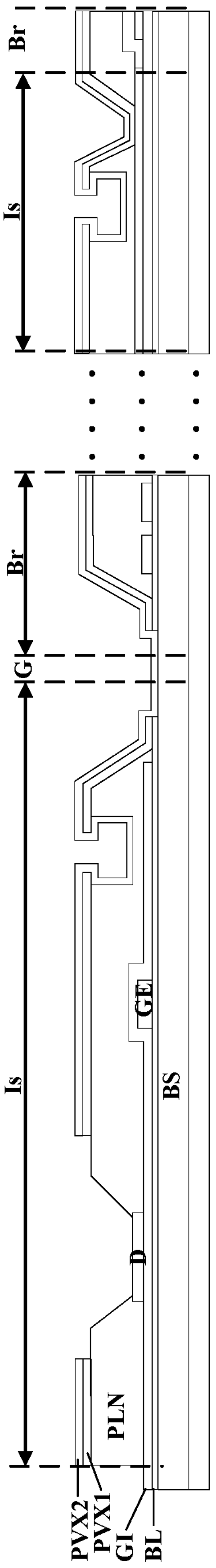
Figure 14H:
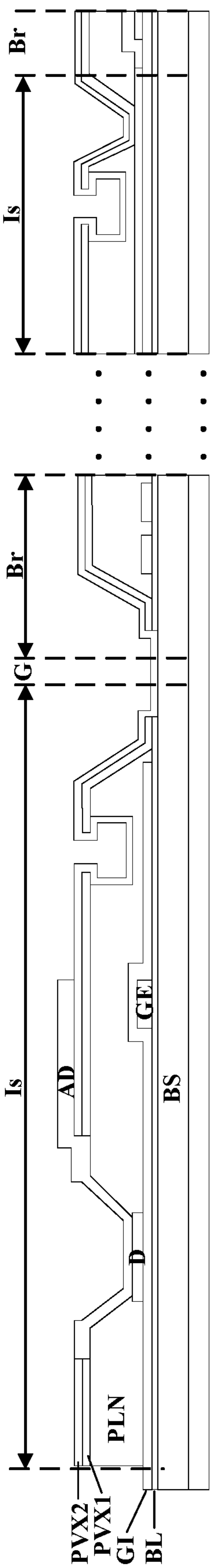
Figure 14I:
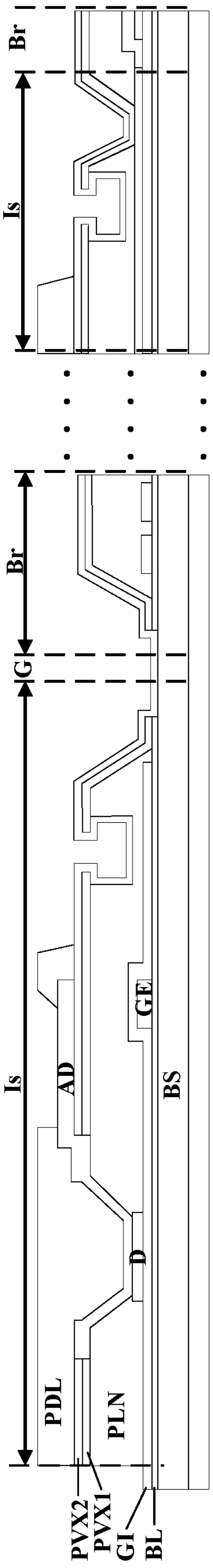
Figure 14J:
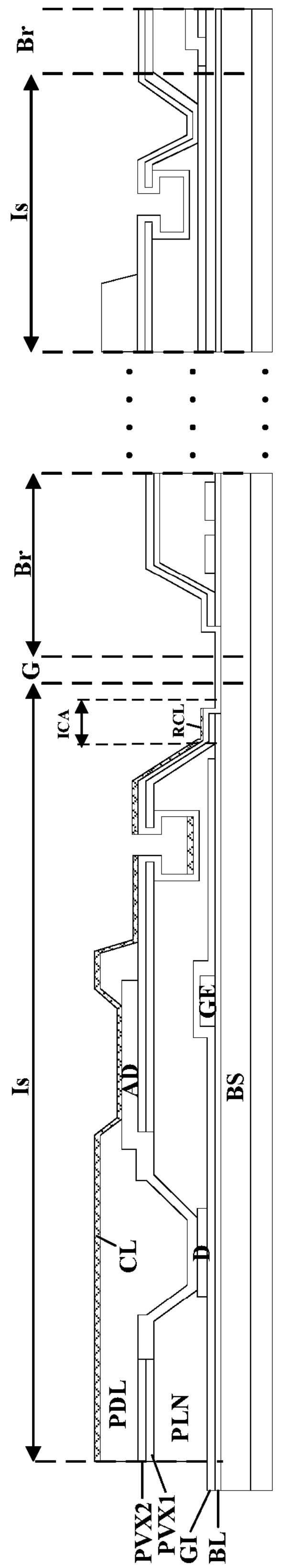
Figure 14K:
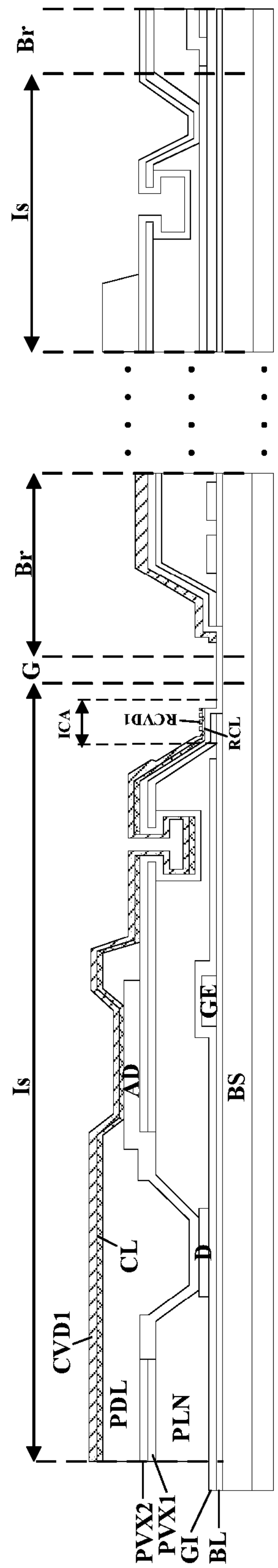
Figure 14L:
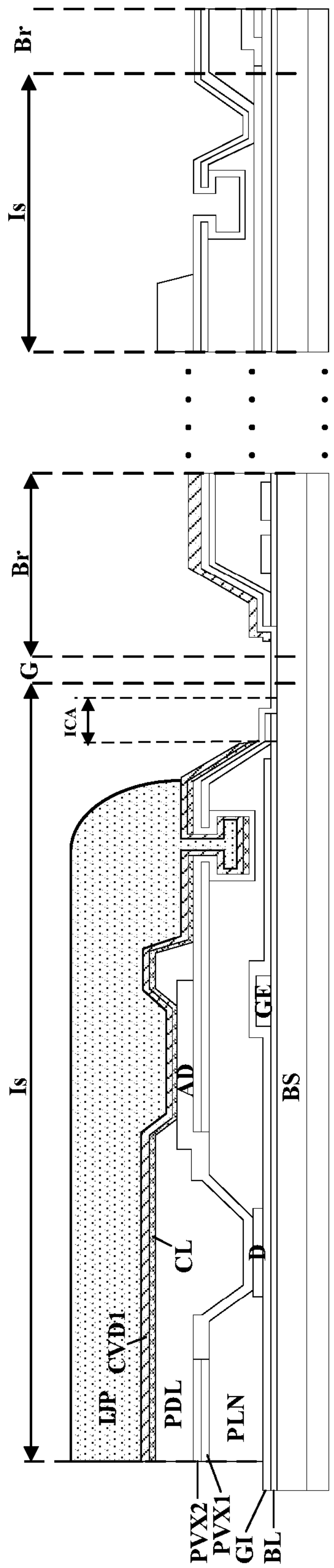
Figure 14M:
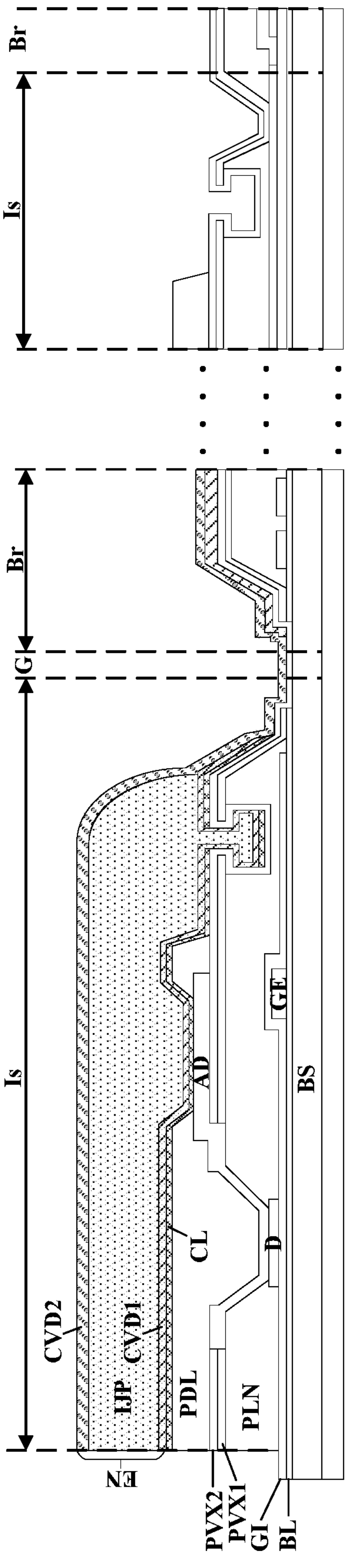
Figure 14N:
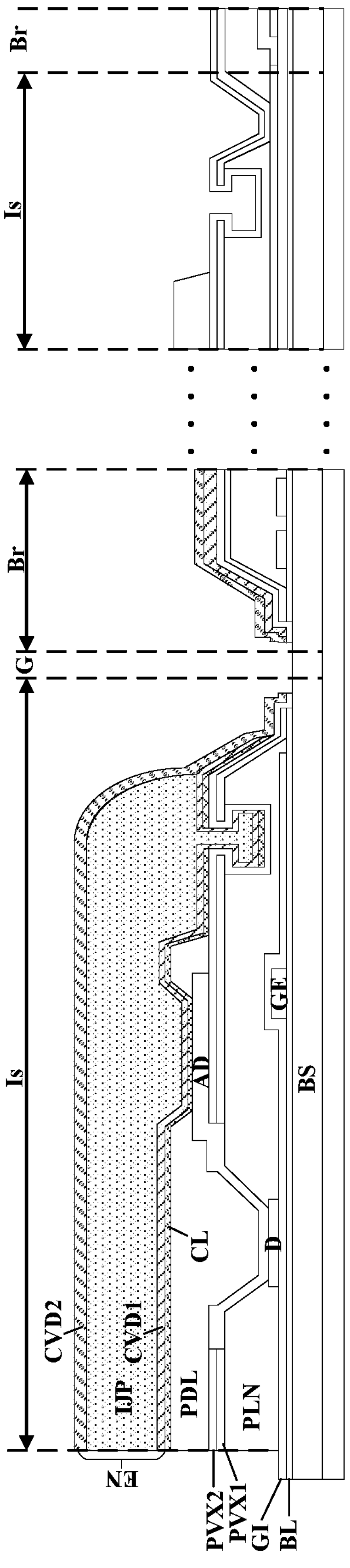
Figure 14O:
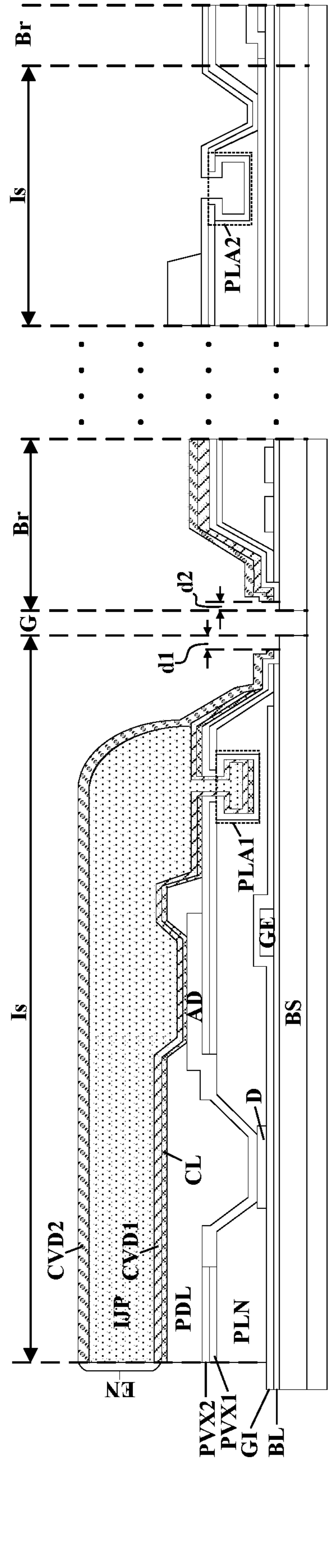

FIG. 14A to FIG. 14O illustrate a process of fabricating a display substrate in some embodiments according to the present disclosure. Left sides of FIG. 14A to FIG. 14O illustrate a region transitioning from a respective island to a respective gap and to a respective bridge, right sides of FIG. 14A to FIG. 14O illustrate a region transitioning from a respective island to a respective bridge. Referring to FIG. 14A, a barrier layer BL is formed on a base substrate BS, and a gate electrode GE is formed on a side of the barrier layer BL away from the base substrate BS.

Referring to FIG. 14B, a gate insulating layer GI is formed on a side of the gate electrode away from the base substrate BS.

Referring to FIG. 14C, a drain electrode D is formed on a side of the gate insulating layer GI away from the base substrate BS.

Referring to FIG. 14D, a planarization layer PLN is formed on a side of the drain electrode D away from the base substrate BS.

Referring to FIG. 14E, a first passivation layer PVX1 is formed on a side of the planarization layer PLN and the drain electrode D away from the base substrate BS.

Referring to FIG. 14F, a first groove GV1 is formed to extend through the first passivation layer PVX1 and extend into the planarization layer PLN, and a second groove GV2 is formed to extend through the first passivation layer PVX1 and extend into the planarization layer PLN.

Referring to FIG. 14G, a second passivation layer PVX2 is formed on a side of the first passivation layer PVX1 away from the base substrate BS. A portion of the second passivation layer PVX2 extends into the first groove GV1 and the second groove GV2.

Referring to FIG. 14H, an anode AD is formed on a side of the second passivation layer PVX2 away from the base substrate BS. The anode AD is connected to the drain electrode D.

Referring to FIG. 14I, a pixel definition layer PDL is formed on a side of the anode AD away from the base substrate BS. The pixel definition layer PDL defines a respective aperture of a plurality of apertures for receiving light emitting materials.

Referring to FIG. 14J, a common layer CL is formed on a side of the pixel definition layer PDL away from the base substrate BS. A portion of the common layer CL extends into the first groove GV1. A residual common layer CL is formed in an inorganic layer contact area ICA.

Referring to FIG. 14K, a first inorganic encapsulating sub-layer CVD1 is formed on a side of the common layer CL away from the base substrate BS. A portion of the first inorganic encapsulating sub-layer CVD1 extends into the first groove GV1. A residual first inorganic encapsulating sub-layer RCVD1 is formed in an inorganic layer contact area ICA.

Referring to FIG. 14L, the residual common layer RCL is removed from the inorganic layer contact area ICA, thereby providing a clean inorganic surface for receiving the second inorganic encapsulating sub-layer CVD2. In some embodiments, removing the residual common layer RCL includes performing an etching process on the substrate. Subsequent to the etching process, the residual common layer RCL and/or the residual first inorganic encapsulating sub-layer RCVD1 are removed. Optionally, a thickness of at least a portion of the first inorganic encapsulating sub-layer CVD1 is reduced. Optionally, a thickness of a portion of the inorganic insulating layer IOL in the inorganic layer contact area ICA is reduced. Optionally, the etching process is a dry etching process.

Subsequent to removing the residual common layer RCL and/or the residual first inorganic encapsulating sub-layer RCVD1, an organic encapsulating sub-layer IJP is formed on a side of the first inorganic encapsulating sub-layer CVD1 away from the base substrate BS. A portion of the organic encapsulating sub-layer IJP extends into the first groove GV1.

Referring to FIG. 14M, a second inorganic encapsulating sub-layer CVD2 is formed on a side of the organic encapsulating sub-layer IJP away from the base substrate BS.

Referring to FIG. 14N, a portion of the second inorganic encapsulating sub-layer CVD2 in a region correspond to the respective gap is removed. Optionally, a portion of the second passivation layer PVX2 in a region correspond to the respective gap is removed.

Referring to FIG. 14O, a portion of the base substrate BS in a region correspond to the respective gap is removed, thereby forming the respective gap.

Referring to FIG. 14O, a respective first pillar of the one or more first pillars PLA1 includes a portion of the second passivation layer PVX2, a portion of the common layer CL, a portion of the first inorganic encapsulating sub-layer CVD1, and a portion of the organic encapsulating sub-layer IJP. A respective second pillar of the one or more second pillars PLA2 includes a portion of the second passivation layer PVX2.

Referring to FIG. 14O, in some embodiments, in a cross-section along a plane perpendicular to the base substrate and intersecting the first inorganic encapsulating sub-layer CVD1, the organic encapsulating sub-layer IJP, and the second inorganic encapsulating sub-layer CVD2 (e.g., the cross-section depicted in FIG. 14O), an outermost edge of the second inorganic encapsulating sub-layer CVD2 in the respective island is spaced apart from an outermost edge of the base substrate BS in the respective island along the respective gap of the plurality of gaps G by a distance d1, wherein d1>0. Optionally, d1 is equal to or greater than 0.1 μm, e.g., equal to or greater than 0.2 μm, equal to or greater than 0.3 μm, equal to or greater than 0.4 μm, equal to or greater than 0.5 μm, equal to or greater than 0.6 μm, equal to or greater than 0.7 μm, equal to or greater than 0.8 μm, equal to or greater than 0.9 μm, equal to or greater than 1.0 μm, equal to or greater than 1.1 μm, equal to or greater than 1.2 μm, equal to or greater than 1.3 μm, equal to or greater than 1.4 μm, equal to or greater than 1.5 μm, equal to or greater than 1.6 μm, equal to or greater than 1.7 μm, equal to or greater than 1.8 μm, equal to or greater than 1.9 μm, equal to or greater than 2.0 μm, equal to or greater than 2.5 μm, equal to or greater than 3.0 μm, equal to or greater than 3.5 μm, equal to or greater than 4.0 μm, equal to or greater than 4.5 μm, equal to or greater than 5.0 μm, equal to or greater than 5.5 μm, equal to or greater than 6.0 μm, equal to or greater than 6.5 μm, equal to or greater than 7.0 μm, equal to or greater than 7.5 μm, equal to or greater than 8.0 μm, equal to or greater than 8.5 μm, equal to or greater than 9.0 μm, equal to or greater than 9.5 μm, or equal to or greater than 10.0 μm. In one example, d1 is equal to or greater than 2.0 μm.

In some embodiments, in a cross-section along a plane perpendicular to the base substrate and intersecting the first inorganic encapsulating sub-layer CVD1, the organic encapsulating sub-layer IJP, and the second inorganic encapsulating sub-layer CVD2 (e.g., the cross-section depicted in FIG. 14O), an outermost edge of the second inorganic encapsulating sub-layer CVD2 in the respective island is spaced apart from an outermost edge of the base substrate BS in the respective island along the respective gap of the plurality of gaps G by a distance d2, wherein d2>0. Optionally, d2 is equal to or greater than 0.1 μm, e.g., equal to or greater than 0.2 μm, equal to or greater than 0.3 μm, equal to or greater than 0.4 μm, equal to or greater than 0.5 μm, equal to or greater than 0.6 μm, equal to or greater than 0.7 μm, equal to or greater than 0.8 μm, equal to or greater than 0.9 μm, equal to or greater than 1.0 μm, equal to or greater than 1.1 μm, equal to or greater than 1.2 μm, equal to or greater than 1.3 μm, equal to or greater than 1.4 μm, equal to or greater than 1.5 μm, equal to or greater than 1.6 μm, equal to or greater than 1.7 μm, equal to or greater than 1.8 μm, equal to or greater than 1.9 μm, equal to or greater than 2.0 μm, equal to or greater than 2.5 μm, equal to or greater than 3.0 μm, equal to or greater than 3.5 μm, equal to or greater than 4.0 μm, equal to or greater than 4.5 μm, equal to or greater than 5.0 μm, equal to or greater than 5.5 μm, equal to or greater than 6.0 μm, equal to or greater than 6.5 μm, equal to or greater than 7.0 μm, equal to or greater than 7.5 μm, equal to or greater than 8.0 μm, equal to or greater than 8.5 μm, equal to or greater than 9.0 μm, equal to or greater than 9.5 μm, or equal to or greater than 10.0 μm. In one example, d2 is equal to or greater than 2.0 μm.

Figure 15:
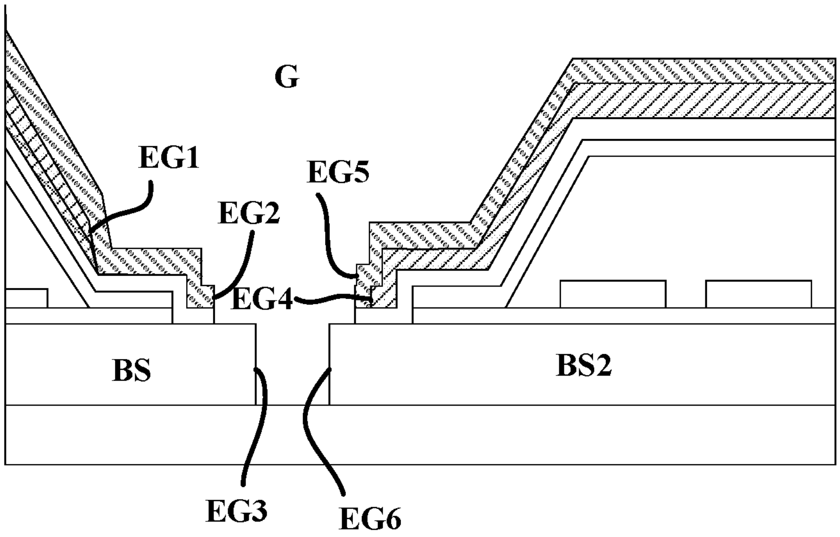
FIG. 15 is a zoom-in view of a gap region in some embodiments according to the present disclosure.

FIG. 15 is a zoom-in view of a gap region in some embodiments according to the present disclosure. Referring to FIG. 14O and FIG. 15, an outermost edge of the first inorganic encapsulating layer CVD1 in the respective island is denoted as EG1, an outermost edge of the second inorganic encapsulating layer CVD2 in the respective island is denoted as EG2, an outermost edge of the base substrate BS in the respective island is denoted as EG3, an outermost edge of the first inorganic encapsulating layer CVD1 in the respective bridge is denoted as EG4, an outermost edge of the second inorganic encapsulating layer CVD2 in the respective bridge is denoted as EG5, an outermost edge of the second base substrate BS2 in the respective bridge is denoted as EG6. As used herein, the term "outermost edge" refers to an edge closest to a respective gap between a respective island and a respective bridge.

Referring to FIG. 8 to FIG. 10, FIG. 11A to FIG. 11S, FIG. 13A to FIG. 13E, and FIG. 14A to FIG. 14O, in some embodiments, in a cross-section along a plane perpendicular to the base substrate BS and intersecting the first inorganic encapsulating sub-layer CVD1 and the second inorganic encapsulating sub-layer CVD2, an outermost edge of the first inorganic encapsulating sub-layer CVD1 is encapsulated by the second inorganic encapsulating sub-layer CVD2, thereby rendering the outermost edge of the first inorganic encapsulating sub-layer CVD1 unexposed.

Referring to FIG. 8 to FIG. 10, FIG. 11A to FIG. 11S, FIG. 13A to FIG. 13E, and FIG. 14A to FIG. 14O, in some embodiments, an outermost edge of the second inorganic encapsulating sub-layer CVD2 in the respective island is spaced apart from an outermost edge of the base substrate BS in the respective island along a respective gap of the plurality of gaps by a distance d1, d1>0.

Referring to FIG. 8 to FIG. 10, FIG. 11A to FIG. 11S, FIG. 13A to FIG. 13E, and FIG. 14A to FIG. 14O, in some embodiments, the display substrate includes a stacked structure comprising a plurality of insulating layers on a second base substrate in a respective bridge of the plurality of bridges Br. Optionally, in the cross-section, an outermost edge of the stacked structure is spaced apart from an outermost edge of the second base substrate in the respective bridge along a respective gap of the plurality of gaps G by a distance d2, d2>0.

In another aspect, the present invention provides a display apparatus, including the display substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating a display substrate. In some embodiments, the method includes forming a plurality of islands, forming a plurality of gaps, and forming a plurality of bridges. Optionally, forming a respective island of the plurality of islands includes forming one or more light emitting elements on a base substrate; and forming an encapsulating layer on a side of one or more light emitting elements away from the base substrate, encapsulating the one or more light emitting elements. Optionally, forming the encapsulating layer includes forming a first inorganic encapsulating sub-layer on the one or more light emitting elements and forming a second inorganic encapsulating sub-layer on a side of the organic encapsulating sub-layer away from the first inorganic encapsulating sub-layer. Optionally, in a cross-section along a plane perpendicular to the base substrate and intersecting the first inorganic encapsulating sub-layer and the second inorganic encapsulating sub-layer, an outermost edge of the first inorganic encapsulating sub-layer is encapsulated by the second inorganic encapsulating sub-layer, thereby rendering the outermost edge of the first inorganic encapsulating sub-layer unexposed.

In some embodiments, the method further includes, prior to forming the first inorganic encapsulating sub-layer, forming one or more common layers on the base substrate. The one or more common layers may include, for example, any one of a cathode layer, a hole transport layer, a hole injection layer, an electron transport layer, and an electron injection layer. The method further includes forming the first inorganic encapsulating sub-layer on a side of the one or more common layers away from the base substrate. In some embodiments, the method further includes, prior to forming an organic encapsulating sub-layer and the second inorganic encapsulating sub-layer, removing a residual common layer and at least partially (e.g., completely) removing a residual first inorganic encapsulating sub-layer in an inorganic layer contact area, thereby providing a clean inorganic surface for receiving the second inorganic encapsulating sub-layer. In some embodiments, removing the residual common layer includes performing an etching process on the substrate. Subsequent to the etching process, the residual common layer and/or the residual first inorganic encapsulating sub-layer are removed. Optionally, a thickness of at least a portion of the first inorganic encapsulating sub-layer is reduced. Optionally, a thickness of a portion of the inorganic insulating layer in the inorganic layer contact area is reduced. Optionally, the etching process is a dry etching process.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term “the invention”, “the present invention” or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use “first”, “second”, etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising a plurality of islands, a plurality of gaps, and a plurality of bridges;

wherein a respective island of the plurality of islands comprises:

a base substrate;

one or more light emitting elements on the base substrate; and an encapsulating layer on a side of the one or more light emitting elements away from the base substrate, encapsulating the one or more light emitting elements;

the encapsulating layer comprises a first inorganic encapsulating sub-layer on a side of the one or more light emitting elements away from the base substrate, and a second inorganic encapsulating sub-layer on a side of the first inorganic encapsulating sub-layer away from the base substrate; and in a cross-section along a plane perpendicular to the base substrate and intersecting the first inorganic encapsulating sub-layer and the second inorganic encapsulating sub-layer, an outermost edge of the first inorganic encapsulating sub-layer is encapsulated by the second inorganic encapsulating sub-layer, thereby rendering the outermost edge of the first inorganic encapsulating sub-layer unexposed;

wherein a thickness of the second base substrate in the respective bridge is less than a thickness of the base substrate in the respective island; and the second base substrate in the respective bridge and the base substrate in the respective island are connected by an adhesive layer in the respective gap.

2. The display substrate of claim 1, wherein an outermost edge of the second inorganic encapsulating sub-layer in the respective island is spaced apart from an outermost edge of the base substrate in the respective island along a respective gap of the plurality of gaps by a distance d1, d1>0.

3. The display substrate of claim 1, comprising a stacked structure comprising a plurality of insulating layers on a second base substrate in a respective bridge of the plurality of bridges;

wherein, in the cross-section, an outermost edge of the stacked structure is spaced apart from an outermost edge of the second base substrate in the respective bridge along a respective gap of the plurality of gaps by a distance d2, d2>0.

4. The display substrate of claim 3, wherein the outermost edge of the stacked structure is an outermost edge of a portion of the second inorganic encapsulating sub-layer in the respective bridge.

5. The display substrate of claim 3, wherein the outermost edge of the stacked structure is an outermost edge of a portion of a planarization layer in the respective bridge.

6. The display substrate of claim 1, wherein inorganic layers in the plurality of islands and the plurality of bridges are absent in the plurality of gaps; and the base substrate in the respective island and a second base substrate in a respective bridge of the plurality of bridges are absent in the plurality of gaps.

7. The display substrate of claim 1, wherein the respective island comprises an inorganic insulating layer on the base substrate; and a portion of the second inorganic encapsulating sub-layer is in direct contact with the inorganic insulating layer in an inorganic layer contact area.

8. The display substrate of claim 7, wherein the display substrate is substantially free of any organic material between the second inorganic encapsulating sub-layer and the inorganic insulating layer in the inorganic layer contact area.

9. The display substrate of claim 7, wherein the inorganic insulating layer extends substantially throughout the respective island; and a thickness of a portion of the inorganic insulating layer in the inorganic layer contact area is less than a thickness of a portion of the inorganic insulating layer outside the inorganic layer contact area and in the respective island.

10. The display substrate of claim 7, wherein a portion of the first inorganic encapsulating sub-layer is in direct contact with the inorganic insulating layer.

11. The display substrate of claim 7, wherein, in a cross-section along a plane perpendicular to the base substrate and intersecting the inorganic insulating layer, the first inorganic encapsulating sub-layer, and the second inorganic encapsulating sub-layer, the inorganic layer contact area has an average width less than 5 μm; and a respective light emitting element in the respective island that is closest to a respective gap of the plurality of gaps has an average distance to the respective gap less than 20 μm.

12. The display substrate of claim 7, wherein the inorganic insulating layer is a second passivation layer;

a portion of the second passivation layer outside the inorganic layer contact area is in direct contact with an anode of the one or more light emitting elements.

13. The display substrate of claim 1, in the respective island, further comprising:

a first groove;

one or more first pillars;

wherein a respective first pillar of the one or more first pillars extends into the first groove.

14. The display substrate of claim 13, wherein the respective first pillar substantially surrounds a region having transistors and capacitors of one or more pixel driving circuits of the respective island.

15. The display substrate of claim 13, wherein the first groove extends through a first passivation layer and extend into a planarization layer; and the respective first pillar comprises a portion of a second passivation layer which is on a side of the first passivation layer away from the base substrate, a portion of a common layer, a portion of the first inorganic encapsulating sub-layer, and a portion of an organic encapsulating sub-layer of the encapsulating layer.

16. The display substrate of claim 1, wherein in a region transitioning from the respective island to a respective bridge of the plurality of bridges, the display substrate further comprises:

a second groove; and one or more second pillars;

wherein a respective second pillar of the one or more second pillars extends into the second groove.

17. The display substrate of claim 16, wherein the second groove extends through a first passivation layer and extend into a planarization layer; and the respective second pillar comprises a portion of a second passivation layer which is on a side of the first passivation layer away from the base substrate.

18. The display substrate of claim 1, wherein the respective island comprises a stacked structure comprising a plurality of insulating layers between the base substrate and the first inorganic encapsulating sub-layer;

in a cross-section along a plane perpendicular to the base substrate and intersecting the plurality of insulating layers in the stacked structure, any of the plurality of insulating layers are completely unexposed;

outermost edges of the plurality of insulating layer are encapsulated by the first inorganic encapsulating sub-layer, thereby rendering the outermost edges of the plurality of insulating layer unexposed; and the first inorganic encapsulating sub-layer and the second inorganic encapsulating sub-layer are in direct contact with the base substrate.

19. A display apparatus, comprising the display substrate of claim 1, and one or more integrated circuits connected to the display substrate.

* * * * *